(12) United States Patent
Hayashi et al.

(10) Patent No.: US 9,324,749 B2
(45) Date of Patent: Apr. 26, 2016

(54) COLOR IMAGING ELEMENT AND IMAGING DEVICE

(71) Applicant: FUJIFILM CORPORATION, Tokyo (JP)

(72) Inventors: Kenkichi Hayashi, Saitama (JP); Seiji Tanaka, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/589,283

(22) Filed: Jan. 5, 2015

(65) Prior Publication Data

US 2015/0109493 A1    Apr. 23, 2015

Related U.S. Application Data

(63) Continuation of application No. PCT/JP2013/068232, filed on Jul. 3, 2013.

(30) Foreign Application Priority Data

Jul. 6, 2012  (JP) .................................. 2012-152679

(51) Int. Cl.
*H01L 27/146* (2006.01)
*H04N 9/04* (2006.01)

(52) U.S. Cl.
CPC .......... *H01L 27/14621* (2013.01); *H04N 9/045* (2013.01); *H04N 2209/045* (2013.01)

(58) Field of Classification Search
CPC ............. H01L 27/14621; H04N 9/045; H04N 2209/045; H04N 2209/046
See application file for complete search history.

(56) References Cited

U.S. PATENT DOCUMENTS

2002/0149686 A1  10/2002  Taubman
2003/0086008 A1   5/2003  Nagano
2007/0153104 A1   7/2007  Ellis-Monaghan et al.
(Continued)

FOREIGN PATENT DOCUMENTS

JP       8-23543 A     1/1996
JP    11-285012 A    10/1999
(Continued)

OTHER PUBLICATIONS

Savard, "Color Filter Array Designs," http://www.quadibloc.xom/other/cfaint.htm, dated to Feb. 19, 2006 via the Wayback Machine at archive.org.*

(Continued)

*Primary Examiner* — Dennis Hogue
(74) *Attorney, Agent, or Firm* — Birch, Stewart, Kolasch & Birch, LLP

(57) ABSTRACT

A color filter array of a color imaging element is formed with a basic array pattern repeatedly disposed in a horizontal direction and a vertical direction. The basic array pattern is formed with RGB filters arrayed in an array pattern corresponding to 5×5 pixels in the horizontal direction and the vertical direction. A ratio of all pixel numbers of a G pixel is made larger than a ratio of a pixel number of each color of RB. The G filter is disposed in each line in the horizontal, vertical and oblique directions of the color filter array. One or more R and B filters are disposed in each filter line in the horizontal and vertical directions of the color filter array in the basic array pattern. Filters of different colors are adjacently disposed in each of the horizontal, vertical and oblique directions of the R and B filter.

8 Claims, 20 Drawing Sheets

(56) References Cited

U.S. PATENT DOCUMENTS

| | | |
|---|---|---|
| 2009/0027527 A1 | 1/2009 | Pang et al. |
| 2009/0195551 A1* | 8/2009 | Quan ............................ 345/600 |
| 2011/0235017 A1* | 9/2011 | Iwasaki ........................ 356/4.01 |
| 2012/0327277 A1* | 12/2012 | Myhrvold ..................... 348/279 |

FOREIGN PATENT DOCUMENTS

| | | |
|---|---|---|
| JP | 2000-308080 A | 11/2000 |
| JP | 2001-85664 A | 3/2001 |
| JP | 2003-153291 A | 5/2003 |
| JP | 2005-136766 A | 5/2005 |
| JP | 2007-184904 A | 7/2007 |
| JP | 2009-27684 A | 2/2009 |
| WO | WO 2012114993 A1 * | 8/2012 |

OTHER PUBLICATIONS

International Search Report issued in PCT/JP2013/068232, dated Sep. 17, 2013.
Written Opinion of the International Searching Authority issued in PCT/JP2013/068232, dated Sep. 17, 2013.

* cited by examiner

FIG.11

(BASIC ARRAY PATTERN) P2'

| B | R | G | G | G |
|---|---|---|---|---|
| R | G | B | G | G |
| G | G | R | G | B |
| G | B | G | R | G |
| G | G | G | B | R |

FIG.12

(BASIC ARRAY PATTERN) P3'

| B | R | G | G | G |
|---|---|---|---|---|
| R | G | B | G | G |
| G | G | G | R | B |
| G | B | R | G | G |
| G | G | G | B | R |

FIG.13

36(COLOR FILTER ARRAY)

FIG.19

(BASIC ARRAY PATTERN) P7    48 (COLOR FILTER ARRAY)

|     | R | B | G | G | G | G | G | R | B | G | G | G | G | G |
|-----|---|---|---|---|---|---|---|---|---|---|---|---|---|---|
| 23R | G | G | R | B | G | G | G | G | G | R | B | G | G | G |
|     | B | G | G | G | R | B | G | B | G | G | G | R | B | G |
| 23B | B | G | G | G | G | R | B | G | G | G | G | R |
|     | G | R | B | G | G | G | G | G | R | B | G | G | G | G |
| 23G | G | G | G | R | B | G | G | G | G | G | R | B | G | G |
|     | G | G | G | G | G | R | B | G | G | G | G | G | R | B |

FIG.20

(BASIC ARRAY PATTERN) P8    50 (COLOR FILTER ARRAY)

|     | R | B | G | G | G | G | G | R | B | G | G | G | G | G |
|-----|---|---|---|---|---|---|---|---|---|---|---|---|---|---|
| 23R | B | G | R | G | G | G | G | B | G | R | G | G | G | G |
| 23B | G | G | G | R | B | G | G | G | G | G | R | B | G | G |
|     | G | G | G | B | G | G | G | G | G | G | B | G | G | G |
| 23G | G | R | B | G | G | G | G | G | R | B | G | G | G | G |
|     | G | G | G | R | B | G | G | G | G | G | R | B | G | G |
|     | G | G | G | G | G | R | B | G | G | G | G | G | R | B |

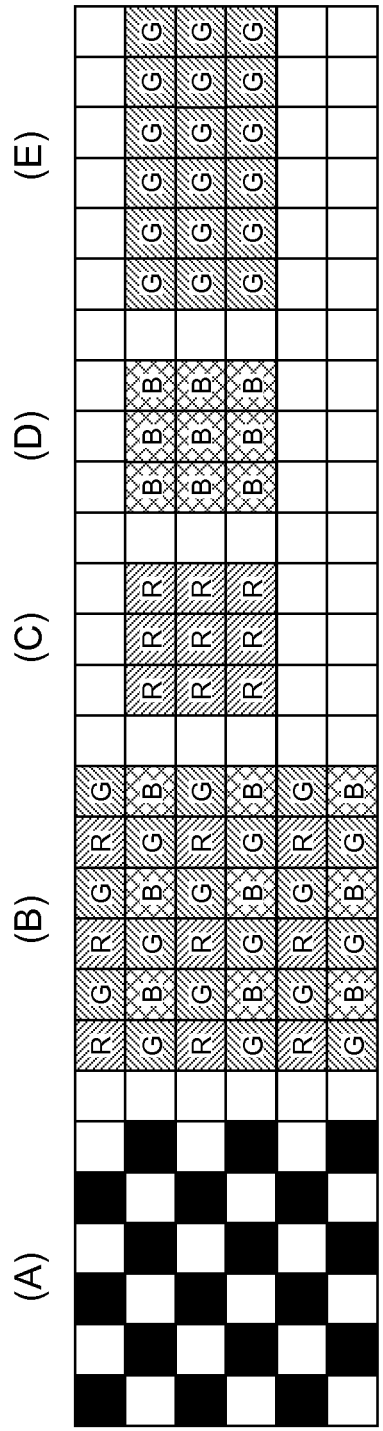

COLOR IMAGING ELEMENT AND IMAGING DEVICE

CROSS-REFERENCE TO RELATED APPLICATIONS

This application is a Continuation of PCT International Application No. PCT/JP2013/068232 filed on Jul. 3, 2013, which claims priority under 35 U.S.C §119(a) to Japanese Patent Application No. 2012-152679 filed on Jul. 6, 2012. Each of the above applications is hereby expressly incorporated by reference, in their entirety, into the present application.

BACKGROUND OF THE INVENTION

1. Field of the Invention

The present invention relates to a color imaging element and an imaging device, in particular, to a color imaging element capable of reducing occurrence of color moire and realizing high resolution, and an imaging device using such a color imaging element.

2. Description of the Related Art

In a single-plate color imaging element, since a monochromatic color filter is set on each pixel, each pixel has only monochrome color information. Therefore, since an output image of the single-plate color imaging element is a RAW image (mosaic image), a multi-channel image is acquired by processing (demosaicing process) that interpolates a missing color pixel with a surrounding pixel. In this case, there is a problem in reproduction characteristic of a high-frequency image signal, and aliasing easily occurs in a taken image of the color imaging element as compared with a black-and-white imaging element. Therefore, it is an important problem to expand a reproduction band and achieve high resolution while reducing the occurrence of color moire (false color).

In a primary color Bayer array that is a color array of a color filter that is used in the single-plate color imaging element most widely, green (G) pixels are disposed in a checkered pattern and red (R) and blue (B) are disposed in a line-sequential manner. Therefore, there is a problem in reproduction precision when generating a high frequency signal in which G signals are in the oblique direction and R and B signals are in the horizontal and vertical directions.

In a case where a black-and-white stripe pattern (high-frequency image) as illustrated in portion (A) of FIG. 22 enters a color imaging element having a color filter of the Bayer array illustrated in portion (B) of FIG. 22, when this is distributed according to the Bayer color array and comparison is performed in each color, as illustrated in portions (C) to (E) of FIG. 22, R becomes a mosaic color image of light and flat, B becomes a mosaic color image of dark and flat, and G becomes a mosaic color image of light and shade. That is, it is essentially a black-and-white image and concentration difference (level difference) is not caused among RGB, but it enters a state where the image is colored depending on the color array and an input frequency.

Similarly, in a case where an oblique black-and-white high-frequency image as illustrated in portion (A) of FIG. 23 enters an imaging element having a color filter of the Bayer array illustrated in portion (B) of FIG. 23, when this is distributed according to the Bayer color array and comparison is performed in each color, as illustrated in portions (C) to (E) of FIG. 23, R and B become a color image of light and flat and G becomes a color image of dark and flat. If a value of black is assumed to be 0 and a value of white is assumed to be 255, only G becomes 255 and therefore the oblique black-and-white high-frequency image becomes green. Thus, in the Bayer array, it is not possible to correctly reproduce an oblique high-frequency image.

In general, it is avoided by disposing an optical low-pass filter including a birefringent material such as crystal in front of the color imaging element and optically decreasing the high frequency in the imaging device using single-plate color imaging elements. However, it is possible to mitigate coloring by the aliasing of high-frequency signals in this method, but there is a problem that resolution degrades due to the negative effect.

To solve such a problem, there is suggested a color imaging element where a color filter array of a color imaging element is assumed to be a three-color random array satisfying array restriction conditions in which an arbitrary target pixel is adjacent to three colors including a color of the target pixel on any of four sides of the target pixel (Japanese Patent Application Laid-Open No. 2000-308080: PTL 1).

Moreover, there is suggested an image sensor of a color filter array (color imaging element) where the image sensor includes a plurality of filters with different spectral sensitivities, and a first filter and a second filter among them are alternately disposed in a first period in one diagonal direction of a pixel grid of the image sensor and are alternately disposed in a second period in the other diagonal direction (Japanese Patent Application Laid-Open No. 2005-136766: PTL 2).

In addition, there is suggested a color array where, in a color solid-state imaging element of three primary colors of RGB (color imaging element), a set of three pixels in which R, G and B are horizontally disposed are disposed in a zigzag manner in a vertical direction to make appearance probabilities of RGB respectively equal and to cause an arbitrary line (horizontal, vertical and oblique lines) on an imaging plane to pass through all colors (Japanese Patent Application Laid-Open No. 11-285012: PTL 3).

Furthermore, there is suggested a color imaging element where R and B among three primary colors of RGB are disposed every three pixels in horizontal and vertical directions and G is disposed between R and B (Japanese Patent Application Laid-Open No. 8-023543: PTL 4).

SUMMARY OF THE INVENTION

In the color imaging element described in PTL 1, since the filter array is random, when demosaicing process is performed in a subsequent stage, optimization has to be performed every random pattern, and there is a problem that the demosaicing process becomes complex. Moreover, in a random array, it is effective for color moire of low frequency but is not effective for a false color of a high-frequency part. Here, the demosaicing process denotes processing that calculates color information on all of the RGB pixels from the mosaic images of RGB according to the color filter array of the single-plate color imaging element (conversion into a simultaneous type), and also denotes demosaicing processing or synchronization processing (which are equal in this specification).

Moreover, in the color imaging element described in PTL 2, since the G pixels (brightness pixels) are disposed in a checkered pattern, there is a problem that the pixel reproduction precision in a limit resolution area (especially in an oblique direction) is not good.

In the color imaging element described in PTL 3, since there are filters of all colors on an arbitrary straight line, there is an advantage that it is possible to suppress the occurrence of the false color. Meanwhile, in the color imaging element described in PTL 3, since the ratios of the pixel numbers of RGB are equal, there is a problem that the high frequency reproducibility deteriorates as compared with a Bayer array. Here, in the case of the Bayer array, the ratio of the pixel number of G that contributes most to acquire a brightness signal is twice the pixel number of each of R and B.

Meanwhile, in the color imaging element described in PTL 4, the ratio of the pixel number of G is six times that of the pixel number of each of R and B, which is higher than that of the Bayer array, a filter line of only the G pixel exists in the horizontal or vertical direction, and therefore it is not effective for a false color of a high-frequency part.

The present invention is made in view of such circumstances, it is an object to provide a color imaging element that can reduce the occurrence of false colors, achieve high resolution and simplify processing in the subsequent stage as compared with a random array in the related art. Moreover, it is an object of the present invention to provide an imaging device using such a color imaging element.

A color imaging element to achieve the object of the present invention is a single-plate color imaging element including: multiple pixels including photoelectric conversion elements arrayed in a first direction and a second direction which is perpendicular to the first direction; and color filters which are respectively arrayed on the multiple pixels, wherein: an array of the color filters includes a basic array pattern in which the color filters are arrayed in an array pattern corresponding to N×N (N is an odd number equal to or greater than 5) pixels in the first direction and the second direction, and the array is formed by repeatedly disposing the basic array pattern in the first direction and the second direction; the color filters include a first filter corresponding to a first color of one or more colors and second filters corresponding to second colors of two or more colors whose contribution ratio to acquire a brightness signal is lower than that of the first color, and a ratio of all pixel numbers of the first color corresponding to the first filter is larger than a ratio of a pixel number of each color of the second colors corresponding to the second filters; one or more first filters are disposed in a filter line in each direction including the first direction, the second direction, and a third direction and a fourth direction that incline to the first direction and the second direction, in the array of the color filter; each of the second filters of each color of the second colors is disposed in each filter line in the first direction and the second direction in the basic array pattern one by one; and, in the second filter of at least one color in the array of the color filter, the second filter or the first filter of a different color from that second filter is adjacently disposed in each direction including the first direction to the fourth direction.

Moreover, a color imaging element to achieve the object of the present invention is a single-plate color imaging element including: multiple pixels including photoelectric conversion elements arrayed in a first direction and a second direction which is perpendicular to the first direction; and color filters which are respectively arrayed on the multiple pixels, wherein: an array of the color filters includes a basic array pattern in which the color filters are arrayed in an array pattern corresponding to N×N (N is an odd number equal to or greater than 5) pixels in the first direction and the second direction, and the array is formed by repeatedly disposing the basic array pattern in the first direction and the second direction; the color filters include a first filter corresponding to a first color of one or more colors whose transmittance peak is within a wavelength range from 480 nm or more to 570 nm or less, and second filters corresponding to second colors of two or more colors whose transmittance peak is outside the range, and a ratio of all pixel numbers of the first color corresponding to the first filter is larger than a ratio of a pixel number of each color of the second colors corresponding to the second filters; one or more first filters are disposed in a filter line in each direction including the first direction, the second direction, and a third direction and a fourth direction that incline to the first direction and the second direction, in the array of the color filter; each of the second filters of each color of the second colors is disposed in each filter line in the first direction and the second direction in the basic array pattern one by one; and, in the second filter of at least one color in the array of the color filter, the second filter or the first filter of a different color from that second filter is adjacently disposed in each direction including the first direction to the fourth direction.

Moreover, a color imaging element to achieve the object of the present invention is a single-plate color imaging element including: multiple pixels including photoelectric conversion elements arrayed in a first direction and a second direction which is perpendicular to the first direction; and color filters which are respectively arrayed on the multiple pixels, wherein: an array of the color filters includes a basic array pattern in which the color filters are arrayed in an array pattern corresponding to N×N (N is an odd number equal to or greater than 5) pixels in the first direction and the second direction, and the array is formed by repeatedly disposing the basic array pattern in the first direction and the second direction; the color filters include a first filter corresponding to a first color of one or more colors and second filters corresponding to second colors of two or more colors whose transmittance is lower than that of the first filter within a wavelength range from 500 nm or more to 560 nm or less, and a ratio of all pixel numbers of the first color corresponding to the first filter is larger than a ratio of a pixel number of each color of the second colors corresponding to the second filters; one or more first filters are disposed in a filter line in each direction including the first direction, the second direction, and a third direction and a fourth direction that incline to the first direction and the second direction, in the array of the color filter; each of the second filters of each color of the second colors is disposed in each filter line in the first direction and the second direction in the basic array pattern one by one; and, in the second filter of at least one color in the array of the color filter, the second filter or the first filter of a different color from that second filter is adjacently disposed in each direction including the first direction to the fourth direction.

Moreover, a color imaging element to achieve the object of the present invention is a single-plate color imaging element including: multiple pixels including photoelectric conversion elements arrayed in a first direction and a second direction which is perpendicular to the first direction; and color filters which are respectively arrayed on the multiple pixels, wherein: an array of the color filters includes a basic array pattern in which the color filters are arrayed in an array pattern corresponding to N×N (N is an odd number equal to or greater than 5) pixels in the first direction and the second direction, and the array is formed by repeatedly disposing the basic array pattern in the first direction and the second direction; the color filters include first filters corresponding to first colors of two or more colors including a color that most contributes to a brightness signal among three primary colors and a fourth color that is a different color from the three primary colors, and second filters corresponding to second colors of two or more colors other than the first colors, and a ratio of all pixel numbers of each color of the first colors corresponding to the first filters is larger than a ratio of a pixel number of each color of the second colors corresponding to the second filters; one or more first filters are disposed in a filter line in each direction including the first direction, the second direction, and a third direction and a fourth direction that incline to the first direction and the second direction, in the array of the color filter; each of the second filters of each color of the second colors is disposed in each filter line in the first direction and the second direction in the basic array pattern one by one; and, in the second filter of at least one color in the array of the color filter, the second filter or the first filter of a different color from that second filter is adjacently disposed in each direction including the first direction to the fourth direction.

According to the present invention, since one or more first filters are disposed in the filter line in each direction of the first to fourth directions of the array of the color filter, it is possible to improve the reproduction precision of demosaicing processing in a high-frequency area.

Moreover, since one or more second filters of each color are disposed in each filter line in the first direction and second direction of the array of the color filter in the basic array pattern, it is possible to reduce the occurrence of color moire (false color) and achieve high resolution.

Moreover, since predetermined basic array patterns are repeatedly disposed in the horizontal direction and the vertical direction in the array of the color filter, it is possible to perform processing according to the repeating pattern when performing demosaicing processing in the subsequent stage, and simplify the processing in the subsequent stage as compared with a random array in the related art.

Moreover, since the ratio of the pixel number of the first color corresponding to the first filter is made larger than the ratio of the pixel number of each color of the second colors corresponding to the second filters, the aliasing can be suppressed and the high-frequency reproducibility is also good.

Moreover, in each direction including the first direction to the fourth direction in the second filter of at least one color, the first filter or second filter of a different color from that second filter is adjacently disposed, and therefore the second filter is equally disposed in the array of the color filter. By this means, it is possible to accurately perform demosaicing processing of pixels of the second color.

It is preferable that the contribution ratio of the first color to acquire a brightness signal is equal to or greater than 50% and the contribution ratio of the second colors to acquire the brightness signal is less than 50%. Since one or more first filters whose contribution ratio to acquire a brightness signal is higher than that of the second filter are disposed in the filter line in each direction of the first to fourth directions of the array of the color filter, it is possible to improve the reproduction precision of demosaicing processing in a high-frequency area.

It is preferable that, in the each direction of the second filter of each color of the second colors in the basic array pattern, the second filter of a different color from that second filter or the first filter is adjacently disposed. By this means, the second filters of each color are equally disposed in the array of the color filter.

It is preferable that: the basic array pattern includes a filter line in which the first filter and the second filters corresponding to each color of the second colors are arrayed in the first direction, and is formed by arraying multiple filter arrays in the second direction; and positions of the second filters corresponding to each color of the second colors are shifted in the first direction every filter line in the basic array pattern and disposed. By this means, the second filters of each color are equally disposed in the array of the color filter.

It is preferable that, when a direction different from the first direction by θ° shown by an equation (1) is assumed to be a fifth direction, oblique filter arrays of each color, which are formed by separately disposing the second filters corresponding to each color of the second colors along the fifth direction at regular intervals, are disposed at regular intervals along the second direction. By this means, the second filters of each color are equally disposed in the array of the color filter.

$$\theta = \tan^{-1}(1/2) \qquad \text{Equation (1)}$$

It is preferable that one or more second filters corresponding to each color of the second colors are disposed in a filter line in the third direction and the fourth direction in the array of the color filter. By this means, it is possible to reduce color moire (false color) that may be caused by an input image having the high-frequency component in the third and fourth directions.

It is preferable that, in each direction of the second filter of one color among each color of the second colors in the basic array pattern, the second filter of a different color from that second filter or the first filter is adjacently disposed. The second filters of one color are equally disposed in the array of the color filter.

It is preferable that the basic array pattern includes a square array corresponding to 2×2 pixels including the first filter. By this means, since the square array corresponding to 2×2 pixels including the first filter is included in the array of the color filter, it is possible to determine a direction with higher correlation among each direction including the first direction to the fourth direction, by the use of the pixel values of these 2×2 pixels.

It is preferable that, when a direction different from the first direction by θ° shown by an equation (1) is assumed to be a fifth direction, oblique filter arrays formed by disposing the second filters of one color among each color of the second colors at regular intervals along the fifth direction, are disposed at regular intervals along the second direction. By this means, the second filters of one color are equally disposed in the array of the color filter.

$$\theta = \tan^{-1}(1/2) \qquad \text{Equation (1)}$$

It is preferable that, when the color filter is a square shape, the third direction and the fourth direction are different by 45° with respect to the first direction and the second direction respectively.

It is preferable that the first colors include at least any of green and transparency.

It is preferable that the second colors include red and blue.

An imaging device to achieve the object of the present invention includes: an imaging optical system; a color imaging element in which an object image is formed through the imaging optical system; and an image data generation unit configured to generate image data showing the formed object image, where the color imaging element is the color imaging element according to any of the above-mentioned modes.

In the color imaging element and imaging device of the present invention, the first filter is disposed in the filter line of each direction of the first to fourth directions of a color filter array and the ratio of the pixel number of the first color corresponding to the first filter is made larger than the ratios of the pixel numbers of the second colors that are two or more colors excluding the first color and correspond to the second filter. Therefore, it is possible to improve the reproduction precision of demosaicing processing in a high-frequency area and suppress the aliasing.

Moreover, one or more second filters corresponding to each color of second colors of two or more colors are disposed in each filter line in the first direction and the second direction of the array of the color filters in the basic array pattern. Therefore, it is possible to reduce occurrence of color moire (false color) and achieve high resolution. In addition, since the second filters of at least one color are equally disposed in the array of the color filter, it is possible to accurately perform demosaicing processing of pixels corresponding to this second filter.

Moreover, in the array of the color filter, since predetermined basic array patterns are repeated in the first direction and the second direction, it is possible to perform processing according to the repeating pattern when performing demosaicing processing in the subsequent stage. By this means, it is possible to simplify the processing in the subsequent stage as compared with a random array in the related art.

BRIEF DESCRIPTION OF THE DRAWINGS

FIG. 11 is an enlarged view of a basic array pattern of a color filter array of a 2-2nd embodiment;

FIG. 12 is an enlarged view of a basic array pattern of a color filter array of a 2-3rd embodiment;

FIG. 13 is a front view of a color filter array of a third embodiment having a transparent filter;

FIG. 19 is a front view of a basic array pattern of other embodiments in which the basic array pattern of the first embodiment is changed to a basic array pattern corresponding to 7×7 pixels;

FIG. 20 is a front view of a basic array pattern of other embodiments in which the basic array pattern of the second embodiment is changed to a basic array pattern corresponding to 7×7 pixels;

FIG. 23 is another diagram used to describe a problem of a color imaging element having a color filter of a Bayer array in the related art.

DETAILED DESCRIPTION OF EXEMPLARY EMBODIMENTS

[Entire Configuration of Digital Camera]

Figure 1:
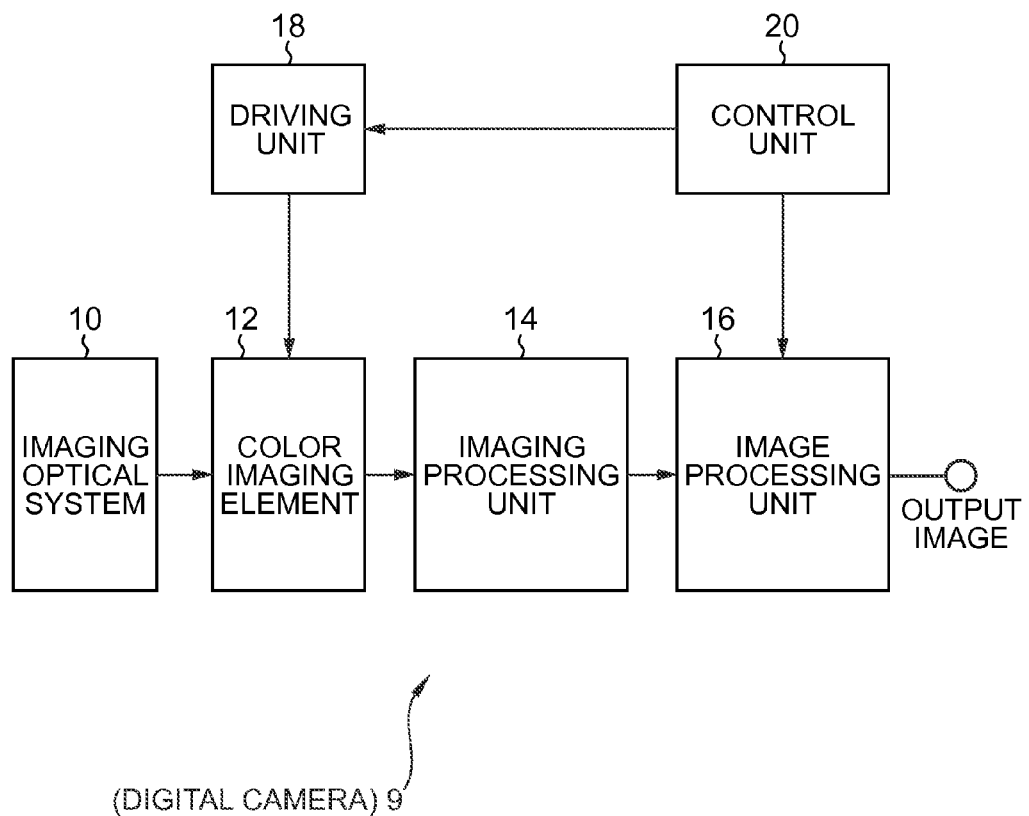
FIG. 1 is a block diagram illustrating an electrical configuration of a digital camera.

FIG. 1 is a block diagram of a digital camera 9 (imaging device) including a color imaging element according to the present invention. The digital camera 9 includes an imaging optical system 10, a color imaging element 12, an imaging processing unit 14, an image processing unit 16, a driving unit 18 and a control unit 20.

The imaging optical system 10 forms an object image on an imaging surface of the color imaging element 12. The color imaging element 12 is a so-called single-plate color imaging element including multiple pixels formed with photoelectric conversion elements two-dimensionally arrayed on the imaging surface, and a color filter provided above the light receiving surface of each pixel. Here, "on" and "above" indicate the direction on the side on which object light enters the imaging surface of the color imaging element 12.

The object image formed on the color imaging element 12 is converted into a signal charge corresponding to the amount of incident light by the photoelectric conversion element of each pixel. The signal charge accumulated in each photoelectric conversion element is sequentially read from the color imaging element 12 as a voltage signal (image signal) corresponding to the signal charge on the basis of a drive pulse given from the driving unit 18 according to an instruction of the control unit 20. The image signals read out from the color imaging element 12 are R, G and B signals showing the mosaic images of red (R), green (G) and blue (B) corresponding to the color filter array of the color imaging element 12. Here, the color imaging element 12 may be other kinds of imaging elements such as a CCD (Charge Coupled Device) imaging element and a CMOS (Complementary Metal Oxide Semiconductor) imaging element.

The image signals read out from the color imaging element 12 are input in the imaging processing unit 14 (image data generation unit). The imaging processing unit 14 includes a correlation double sampling circuit (CDS) to remove reset noise included in the image signals, an AGC circuit to amplify the image signals and control them to be a certain level, and an A/D converter. This imaging processing unit 14 outputs RAW data, which is formed by performing correlation double sampling processing on the input image signals and amplifying and converting them into digital image signals, to the image processing unit 16. Here, in a case where the color imaging element 12 is an MOS imaging element, the A/D converter is often built into in the imaging element, and there may be a case where the above-mentioned correlation double sampling is not required.

The image processing unit 16 (image data generation unit) includes a white balance correction circuit, a gamma correction circuit, a demosaicing process circuit (a processing circuit that calculates color information on all of the RGB pixels from the mosaic images of RGB according to the color filter array of the single-plate color imaging element 12 (conversion into a simultaneous type)), a brightness/color difference signal generation circuit, an outline correction circuit and a color correction circuit, and so on. The image processing unit 16 applies necessary signal processing to the RAW data of mosaic images input from the imaging processing unit 14 according to an instruction from the control unit 20, generates RGB pixel signals having color information on all of the RGB pixels, and, based on this, generates image data (YUV data) formed with brightness data (Y data) and color difference data (Cr and Cb data).

As for the image data generated in the image processing unit 16, a still image is subjected to compression processing in accordance with the JPEG standards by a compression/extension processing circuit, and a moving image is subjected to compression processing in accordance with the MPEG2 standards and subsequently recorded in unillustrated recording media (for example, a memory card) or output to and displayed on display means (not illustrated) such as a liquid crystal monitor. Here, in the present embodiment, the recording media are not limited to the one attachable to and detachable from the digital camera 9 and may be built-in magneto-optic recording media, and the display means is not limited to the one included in the digital camera 9 and may be an external display connected with the digital camera 9.

[Color Imaging Element]

Figure 2:
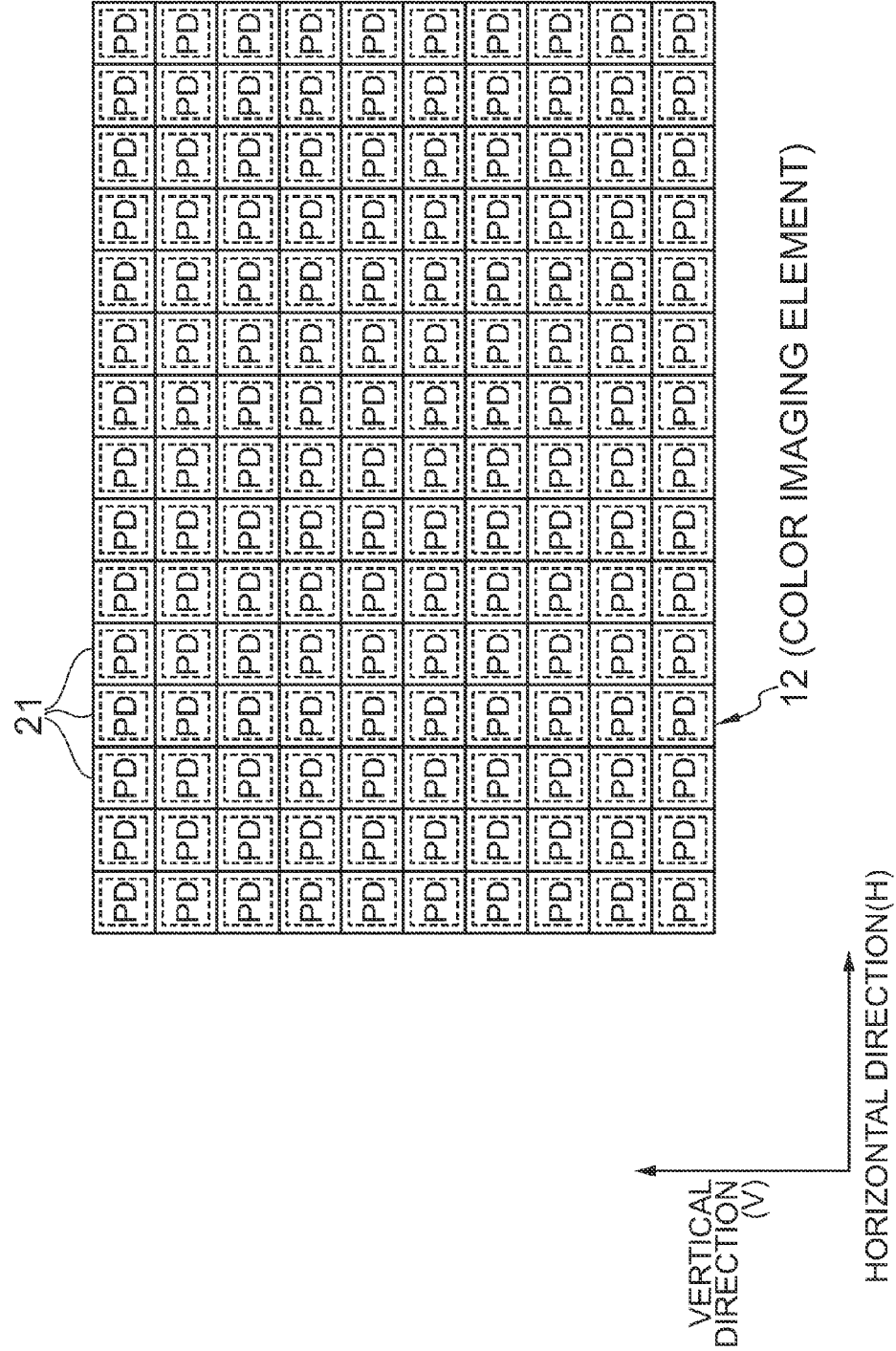
FIG. 2 is a front view of an imaging surface of a color imaging element.

As illustrated in FIG. 2, multiple pixels 21 formed with photoelectric conversion elements PD two-dimensionally arrayed in the horizontal direction and vertical direction are installed in the imaging surface of the color imaging element 12. Here, the horizontal direction corresponds to one direction of the first direction and second direction of the present invention, and the vertical direction corresponds to the other direction of the first direction and second direction of the present invention.

Figure 3:
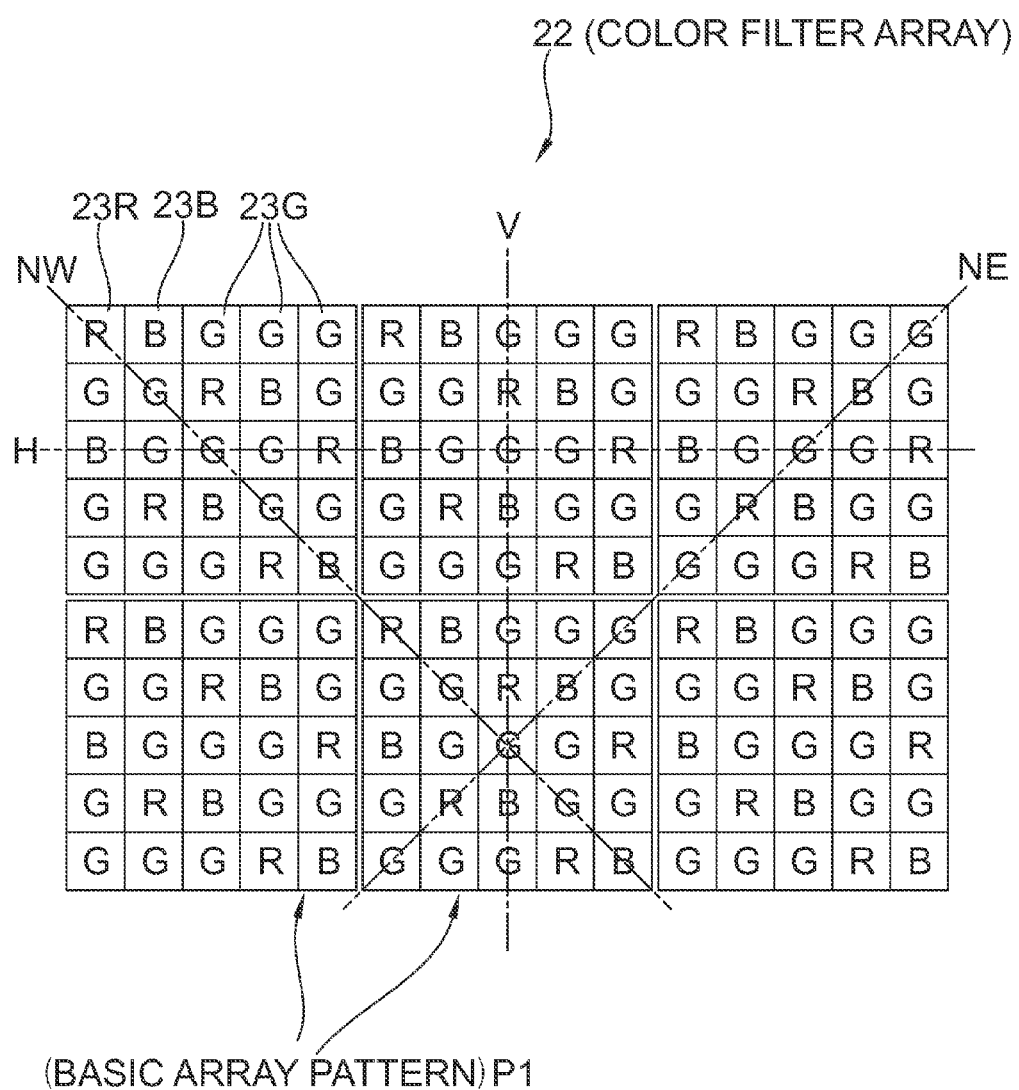
FIG. 3 is a front view of a color filter array of the first embodiment.

As illustrated in FIG. 3, a color filter array 22 formed with the color filter arranged on each pixel 21 is provided on the imaging surface of the color imaging element 12. The color filter array 22 is formed with color filters (hereinafter referred to as "R filter", "G filter" and "B filter") 23R, 23G and 23B of three primary colors of red (R), green (G) and blue (B). Further, any of RGB filters 23R, 23G and 23B is disposed on each pixel 21. In the following, a pixel on which the R filter 23R is disposed is referred to as "R pixel", a pixel on which the G filter 23G is disposed is referred to as "G pixel", and a pixel on which the B filter 23B is disposed is referred to as "B pixel".

Here, the G color corresponds to the first color of the present invention, and the G filter 23G corresponds to the first filter of the present invention. Moreover, the R color and the B color correspond to the second color of the present invention, and RB filters 23R and 23B correspond to the second filter of the present invention. Any of the R filter 23R and the B filter 23B which belong to the second color filter is also referred to as "RB filter" below.

[Color Filter Array of the First Embodiment]

The color filter array 22 has following features (1), (2), (3), (4), (5) and (6).

[Feature (1)]

Figure 4:
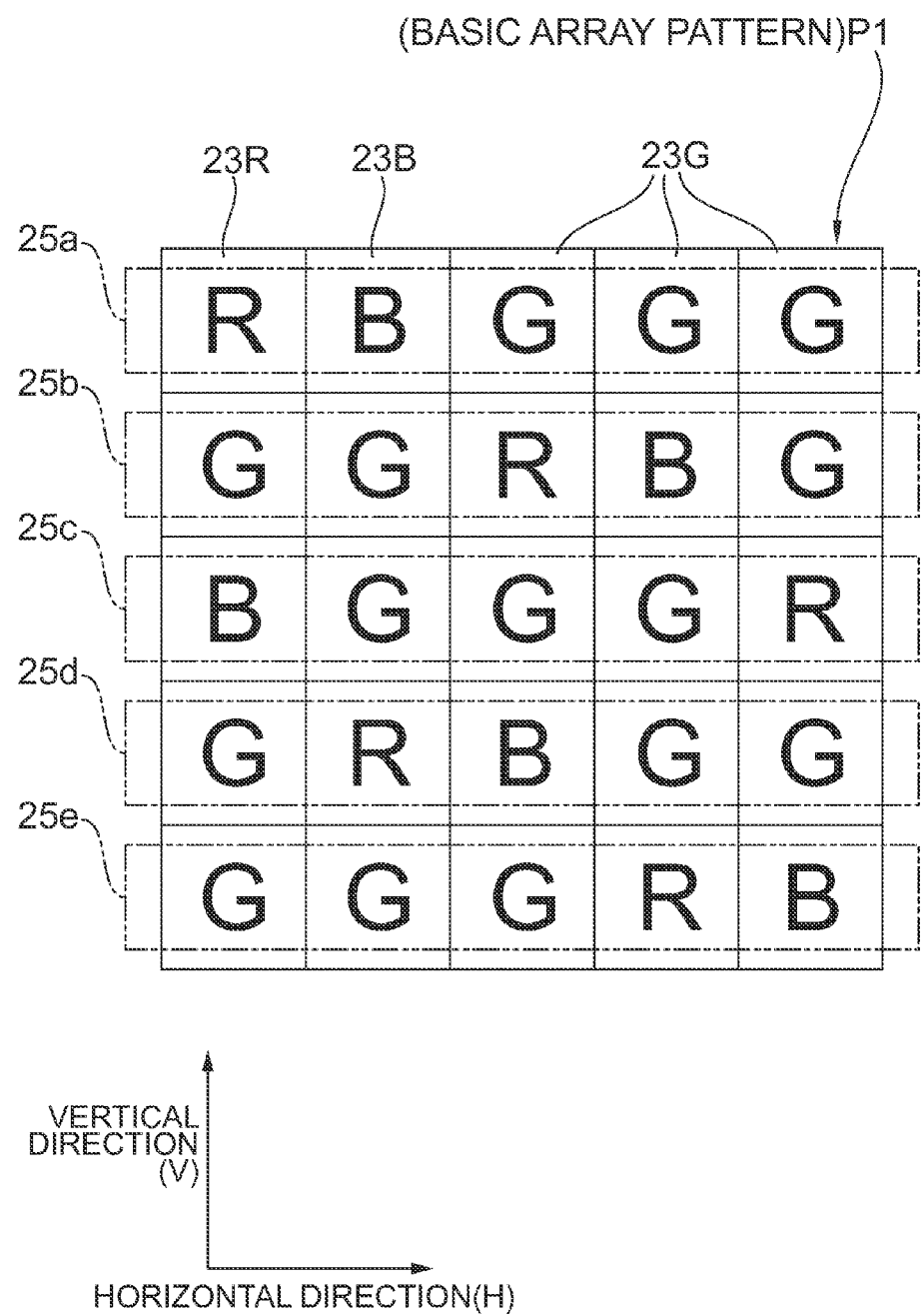
FIG. 4 is an enlarged view of a basic array pattern in FIG. 3.

As illustrated in FIGS. 3 and 4, the color filter array 22 includes a basic array pattern P1 that is a square array pattern corresponding to 5×5 pixels, and this basic array pattern P1 is repeatedly disposed on the horizontal direction (H) and the vertical direction (V). Therefore, the R filter 23R, the G filter 23G and the B filter 23B of the respective colors are arrayed in a predetermined period in the color filter array 22. Therefore, when performing demosaicing process or the like on R, G and B signals read out from the color imaging element 12, it is possible to perform processing according to a repeating pattern. As a result, it is possible to simplify processing in the subsequent stage as compared with a random array in the related art.

Moreover, in a case where thinning processing is performed in units of the basic array pattern P1 to reduce an image, a color filter array after the thinning processing can be assumed to be the same as a color filter array before the thinning processing, and it is possible to use a common processing circuit.

In the basic array pattern P1, five kinds of filter lines 25a, 25b, 25c, 25d and 25e parallel to the horizontal direction are arrayed in the vertical direction (see FIG. 4). Each of the filter lines 25a to 25e is formed by arraying three 3 G filters 23G, one R filters 23R and one B filter 23B in the horizontal direction, and the disposition of the RGB filters 23R, 23G and 23B is decided so as to satisfy following features (2) to (6).

[Feature (2)]

In the color filter array 22, the G filter 23G is disposed in each filter line in the horizontal (H), vertical (V) and oblique (NE, NW) directions. Here, NE means the diagonally upper light (lower left) direction and corresponds to one direction of a third direction and a fourth direction of the present invention. Moreover, NW means the diagonally lower right (upper left) direction and corresponds to another direction of the third direction and fourth direction of the present invention. Since RGB filters 23R, 23G and 23B are square shapes, the NE direction and the NW direction are directions of 45° with respect to the horizontal direction and the vertical direction respectively. Here, this angle may increase or decrease according to an increase or decrease in the length of each side in the horizontal direction and vertical direction of the RGB filters 23R, 23G and 23B. For example, in a case where a color filter of a rectangle shape different from the square shape is used, the diagonal line directions are the oblique direction (NE and NW directions). Here, even if the color filter has the rectangle shape different from the square shape, in a case where this color filter or a pixel is disposed in a square grid shape, the NE direction and the NW direction are directions of 45° with respect to the horizontal direction and the vertical direction respectively. In addition, in a case where multiple pixels and color filters are arrayed in a rectangular grid shape, the diagonal line direction of the rectangular lattice corresponds to the oblique directions (NE and NW directions).

As for the G color, the contribution ratio to acquire a brightness (Y) signal (above-mentioned brightness data) is higher than that of the R color and the B color. That is, the contribution ratio in the R color and the B color is lower than that of the G color. When a specific explanation is given, the image processing unit 16 mentioned above generates a Y signal from RGB pixel signals having color information on all of the RGB pixels, according to following equation (1). Following equation (1) is an equation generally used to generate the Y signal in the color imaging element 12. In this equation (1), since the contribution ratio of the G color to a brightness signal becomes 60%, the G color has a higher contribution ratio than that of the R color (contribution ratio of 30%) and the B color (contribution ratio of 10%). Therefore, the G color is a color that most contributes to the brightness signal among three primary colors.

$$Y = 0.3R + 0.6G + 0.1B \qquad \text{Equation (1)}$$

Since such the G filter 23G is disposed in each filter line of the horizontal (H), vertical (V) and oblique (NE, NW) directions of the color filter array 22, it is possible to improve the reproduction precision of demosaicing process in a high-frequency area without depending on the direction of high frequency in an input image.

[Feature (3)]

The numbers of pixels of the R pixel, G pixel and B pixel corresponding to the RGB filters 23R, 23G and 23B in the basic array pattern P1 are 5 pixels, 15 pixels and 5 pixels respectively. Therefore, since the ratio of the respective pixel numbers of the RGB pixels is 1:3:1, the ratio of the pixel number of the G pixel that most contributes to acquire a brightness signal is higher than the ratio of the respective pixel numbers of the R pixel and the B pixel.

Thus, since the ratio of the pixel number of the G pixel and the ratios of respective pixel numbers of the R and B pixels are different, especially, since the ratio of the pixel number of the G pixel that most contributes to acquire the brightness signal is made larger than the ratios of respective pixel numbers of the R and B pixels, it is possible to suppress aliasing at the time of demosaicing process and improve the high-frequency reproducibility.

[Feature (4)]

One R filter 23R and one B filter 23B are disposed in each filter line in the horizontal direction (H) and vertical direction (V) of the color filter array 22 in the basic array pattern P1.

Since the R filter 23R and the B filter 23B are disposed in each filter line in the horizontal direction (H) and vertical direction (V) of the color filter array 22, it is possible to reduce occurrence of color moire (false color). By this means, it is possible not to dispose an optical low-pass filter to suppress the occurrence of the false color in an optical path from the incident surface of the imaging optical system 10 to the imaging surface of the color imaging element 12, or, even in a case where the optical low-pass filter is applied, it is possible to apply the one whose function to cut the high-frequency component is weak to prevent the occurrence of the false color. Alternatively, the optical low-pass filter may not be provided. As a result, it is possible to prevent resolution from deteriorating.

[Feature (5)]

The G filter 23G or the B filter 23B is adjacently disposed in each direction (which is arbitrarily abbreviated as "each direction (H, V, NE and NW)" below) of the horizontal (H), vertical (V) and oblique (NE, NW) directions of the R filter 23R that satisfies above-mentioned feature (4). Moreover, the G filter 23G or the R filter 23R is adjacently disposed in each direction (H, V, NE, NW) of the B filter 23B that satisfies above-mentioned feature (4). Therefore, filters of different colors are adjacently disposed in each direction (H, V, NE, NW) of the RB filters 23R and 23B (feature (5)). That is, the R filters 23R of the identical color or the B filters 23B of the identical color are not adjacently disposed in each direction (H, V, NE, NW).

To satisfy above-mentioned features (4) and (5), in the color filter array 22, the RB filters 23R and 23B in the basic array pattern P1 are shifted every line of the filter lines 25a to 25e in the horizontal direction and disposed. Specifically, the RB filters 23R and 23B are adjacently disposed in the horizontal direction in any of respective filter lines 25a to 25e, for example, the filter line 25a and disposed. Further, the RB filters 23R and 23B in the filter line 25b are shifted by two-pixel interval in the horizontal direction with respect to the RB filters 23R and 23B in the filter line 25 and disposed. In the following, similarly, the positions of the RB filters 23R and 23B are shifted by two-pixel interval in the same direction in order from the filter array 25d to the filter array 25e and disposed. Here, "pixel interval" denotes a pixel interval (pitch) from the central point of a reference pixel (one pixel) to the central point of an adjacent pixel.

Figure 5:
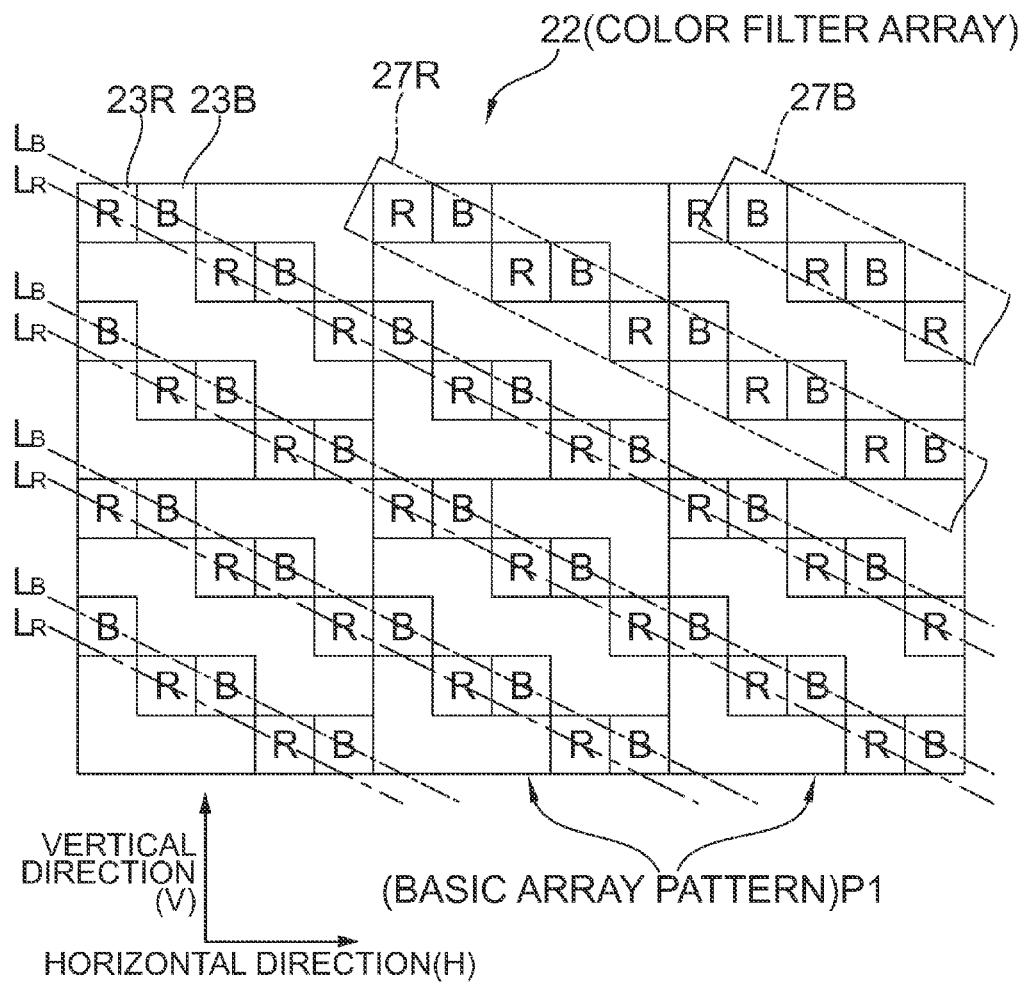
FIG. 5 is an explanatory diagram to describe a diagonal filter array.

By such disposition of the RB filters 23R and 23B, as illustrated in FIG. 5, the color filter array 22 includes oblique filter lines 27R and 27B formed by disposing the RB filters 23R and 23B at regular intervals along filter lines $L_R$ and $L_B$ in the oblique direction. The oblique filter lines 27R and 27B are adjacent to the oblique direction, and these adjacent oblique filter lines 27R and 27B are disposed at regular intervals in the vertical direction (V) in the color filter array 22.

Figure 6:
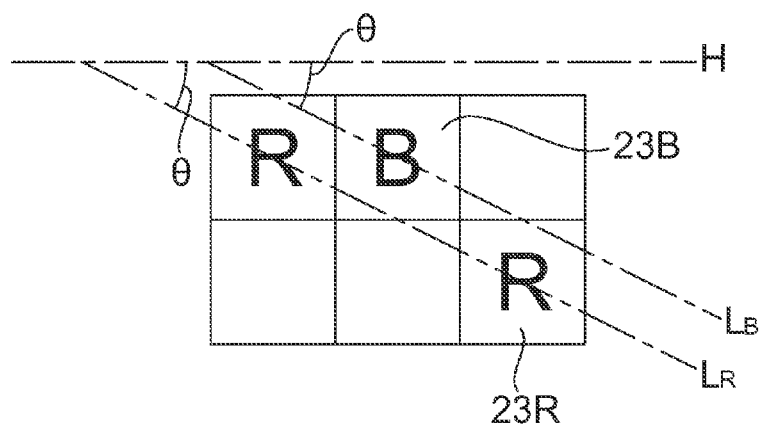
FIG. 6 is an enlarged view that enlarges a part in FIG. 5.

In FIG. 6 that enlarges a part in FIG. 5, the filter lines $L_R$ and $L_B$ in the oblique direction that is the fifth direction of the present invention are inclined by θ° with respect to the horizontal direction (H). This θ is expressed by equation (2) listed below. In equation (2) listed below, "pixel interval number in vertical direction" and "pixel interval number in horizontal direction" denote the pixel interval numbers in the horizontal direction and vertical direction of the R filter 23R or the pixel interval numbers in the horizontal direction or vertical direction of the B filter 23B.

$$\theta = \tan^{-1}(\text{pixel interval number in vertical direction}/\text{pixel interval number in horizontal direction})$$

$$= \tan^{-1}(1/2) \approx 26° \qquad \text{Equation (2)}$$

Returning back to FIG. 5, in the color filter array 22, the oblique filter lines 27R and 27B are disposed at regular intervals along the vertical direction (V). As a result, in the color filter array 22, the RB filters 23R and 23B are equally (including "almost equally") disposed.

Thus, in case where the RB filters 23R and 23B are disposed in the color filter array 22 so as to satisfy above-mentioned features (4) and (5), the RB filters 23R and 23B are equally disposed in the color filter array 22. By this means, it is possible to accurately perform demosaicing processing of the R pixel and the B pixel.

[Feature (6)]

Moreover, in a case where the RB filters 23R and 23B are disposed in the color filter array 22 to satisfy above-mentioned features (4) and (5), one or more RB filters 23R and 23B are disposed on filter lines in the oblique directions (NE, NW) of the color filter array 22. That is, in each oblique direction (NE, NW), a filter line including the R filter 23R and the B filter 23B is disposed adjacently and periodically. Here, to make the filter lines adjacent in the oblique direction means that, in a case where a filter of a square shape whose length of one side is 1 is used, the interval between the filter lines is a √2/2-pixel interval.

Since the RB filters 23R and 23B are disposed in filter lines in the oblique directions (NE, NW), as compared with a case where only above-mentioned feature (4) is satisfied, it is possible to reduce color moire (false color) that may be caused by an input image having the high-frequency component in the oblique directions (NE, NW). By this means, even if an optical low-pass filter having anisotropy in the oblique (NE, NW) directions is not disposed between the imaging optical system 10 and an imaging surface, it is possible to reproduce an image in which the color moire (false color) that may be caused by the input image having the high-frequency component in the oblique directions is suppressed, or, even in a case where the optical low-pass filter is applied, it is possible to suppress specific color moire (false color) by the one whose function to cur the high-frequency component is weak to prevent the occurrence of the false color. Alternatively, the optical low-pass filter may not be provided. As a result, it is possible to prevent resolution in the oblique directions from deteriorating.

[Other Features]

Figure 7:
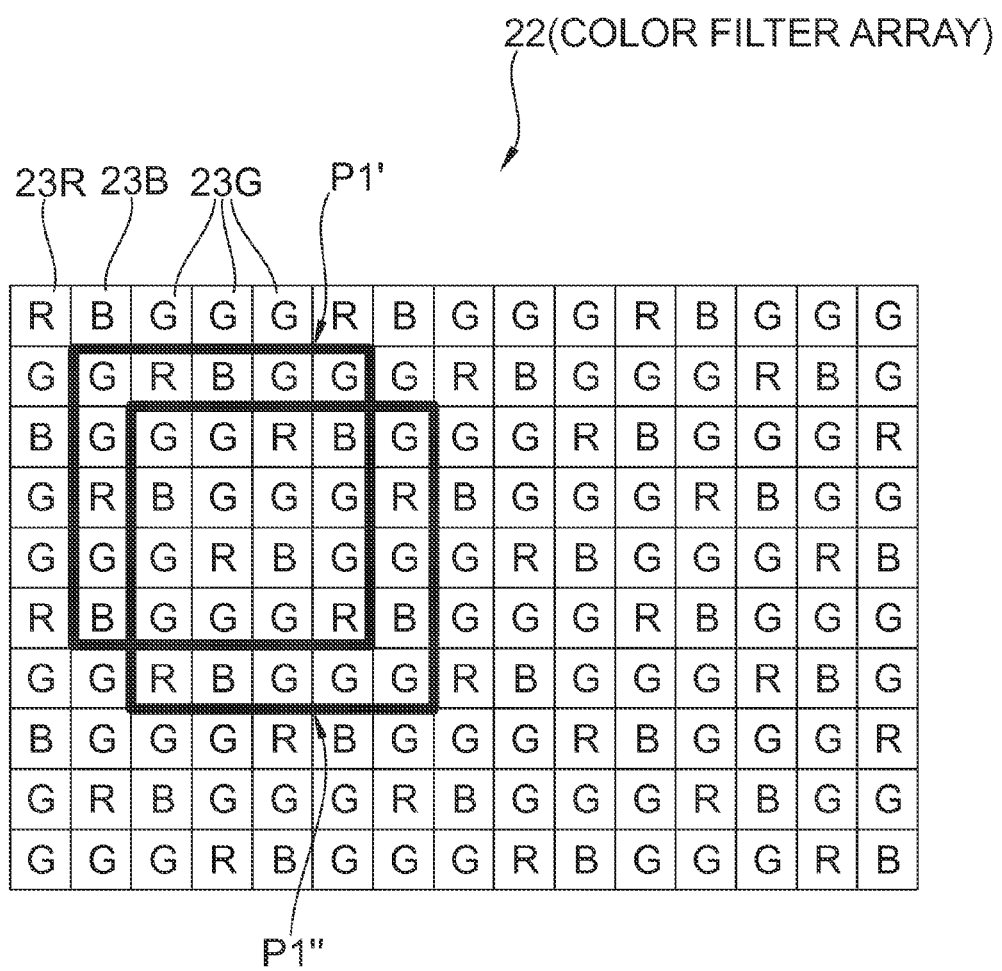
FIG. 7 is an explanatory diagram to describe multiple kinds of basic array patterns.

As illustrated in FIG. 7, when a basic array pattern shifting the basic array pattern P1 by one pixel in the horizontal direction (H) and the vertical direction (V) is assumed to be P1' and a basic array pattern shifting it by two pixels in the horizontal direction (H) and the vertical direction (V) is assumed to be P1", even if these basic array patterns P1' and P1" are repeatedly disposed in the horizontal direction (H) and the vertical direction (V), the same color filter array 22 is provided. Thus, there are multiple basic array patterns that can form the color filter array 22 illustrated in FIG. 3. In the first embodiment, the basic array pattern P1 illustrated in FIGS. 3 and 4 is referred to as "basic array pattern" for convenience sake.

As described above, since the color filter array 22 of the present invention has features (1) to (6), it is possible to simplify demosaicing processing in the subsequent stage, improve the reproduction precision of demosaicing processing in a high-frequency area, suppress the aliasing at the time of demosaicing processing and improve the high-frequency reproducibility, improve the accuracy of demosaicing processing of the R pixel and the B pixel, and realize high resolution.

[Color Imaging Element of Second Embodiment]

Figure 8:
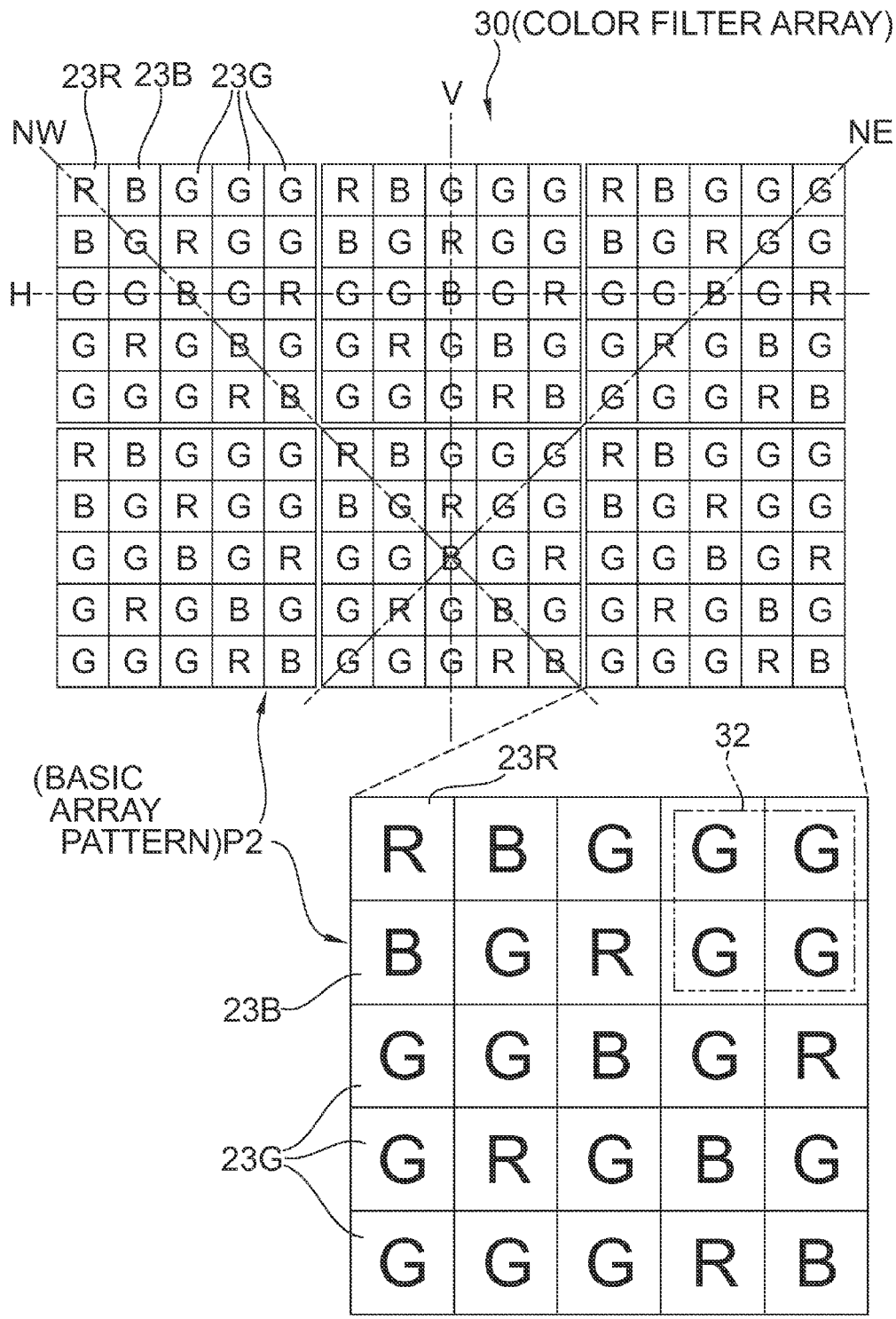
FIG. 8 is a front view of a color filter array of a second embodiment.

Next, the color imaging element of the second embodiment of the present invention is described using FIG. 8. Here, the color imaging element of the second embodiment has basically the same configuration as that of the above-mentioned first embodiment except for that it includes a color filter array 30 having following features (5a) and (7) instead of above-mentioned features (5) and (6). Therefore, regarding what has the same function or configuration as that of the above-mentioned first embodiment, the same reference numeral is assigned and explanation thereof is omitted.

[Color Filter Array of Second Embodiment]

The color filter array 30 includes a basic array pattern P2 formed by arraying RGB filters 23R, 23G and 23B in an array pattern corresponding to 5×5 pixels, and this basic array pattern P2 is repeatedly disposed in the horizontal direction (H) and the vertical direction (V). Therefore, the color filter array 30 has above-mentioned feature (1).

One or more G filters 23G are disposed in each filter line in the horizontal (H), vertical (V) and oblique (NE, NW) directions of the color filter array 30. Moreover, similar to the first embodiment, the ratio of respective pixel numbers of RGB pixels in the basic array pattern P2 becomes 1:3:1. In addition, one or more R filters 23R and B filters 23B are disposed in each filter line in the horizontal direction (H) and vertical direction (V) of the color filter array 30 in the basic array pattern P2. Therefore, the color filter array 30 has above-mentioned features (2) to (4).

[Feature (5a)]

Filters of different colors are adjacently disposed in each direction (H, V, NE, NW) of the R filter 23R in the color filter array 30, but the B filter 23B of the same color is disposed in the oblique directions (NE, NW) of the B filter 23B.

Figure 9:
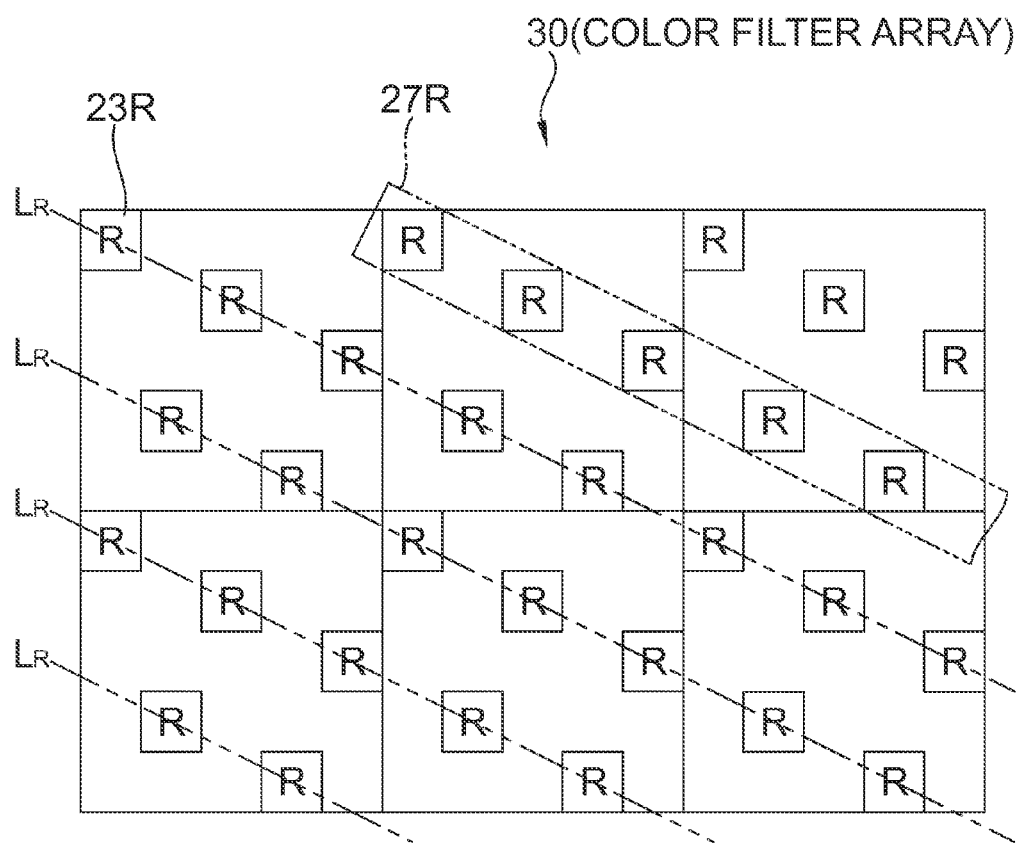
FIG. 9 is an explanatory diagram to describe a diagonal filter array of the second embodiment.

As illustrated in FIG. 9, in the color filter array 30 that satisfies above-mentioned features (4) and (5a), an oblique filter line 27R formed by disposing the R filter 23R at regular intervals along a filter line $L_R$ of the oblique direction is disposed at regular intervals along the vertical direction (V). As a result, since the R filters 23R are equally disposed in the color filter array 30, it is possible to accurately perform demosaicing processing of the R pixel.

[Feature (7)]

Returning back to FIG. 8, the basic array pattern P2 of the color filter array 30 having above-mentioned features (2) to (4) and (5a) includes a square array 32 corresponding to 2×2 pixels in which the G filter 23G is provided.

By extracting 2×2 G pixels corresponding to such the square array 32 and calculating the difference absolute value of the pixel value of the G pixel in the horizontal direction (H), the difference absolute value of the pixel value of the G pixel in the vertical direction (V) and the difference absolute value of the pixel value of the G pixel in the oblique directions (NE, NW), it is possible to determine that there is a correlation in a direction with the smaller difference absolute value among the horizontal direction (H), the vertical direction (V) and the oblique directions (NE, NW). As a result, in the color filter array 30, it is possible to determine a direction with the higher correlation among the horizontal direction (H), the vertical direction (V) and the oblique directions (NE, NW) by the use of information on G pixels of the minimum pixel interval. This direction determination result can be used for processing (demosaicing processing) that performs interpolation from surrounding pixels. Here, in this case, for example, a direction determination processing unit may be provided in the above-mentioned demosaicing processing circuit (image processing unit 16) and the direction determination may be performed in this direction determination processing unit.

As described above, since the color filter array 30 of the present invention has features (5a) and (7) in addition to above-mentioned features (1) to (4), it is possible to simplify demosaicing processing in the subsequent stage, improve the reproduction precision of demosaicing processing in a high-frequency area, suppress the aliasing at the time of demosaicing processing and improve the high-frequency reproducibility, realize high resolution, improve the accuracy of demosaicing processing of the R pixel and determine a direction with the higher correlation.

[Color Filter Array of 2-1st Embodiment]

A color filter array having above-mentioned features (1) to (4), (5a) and (7) is not limited to the one having the array pattern illustrated in FIG. 8 and may be arbitrarily changed within a range that satisfies these features.

Figure 10:
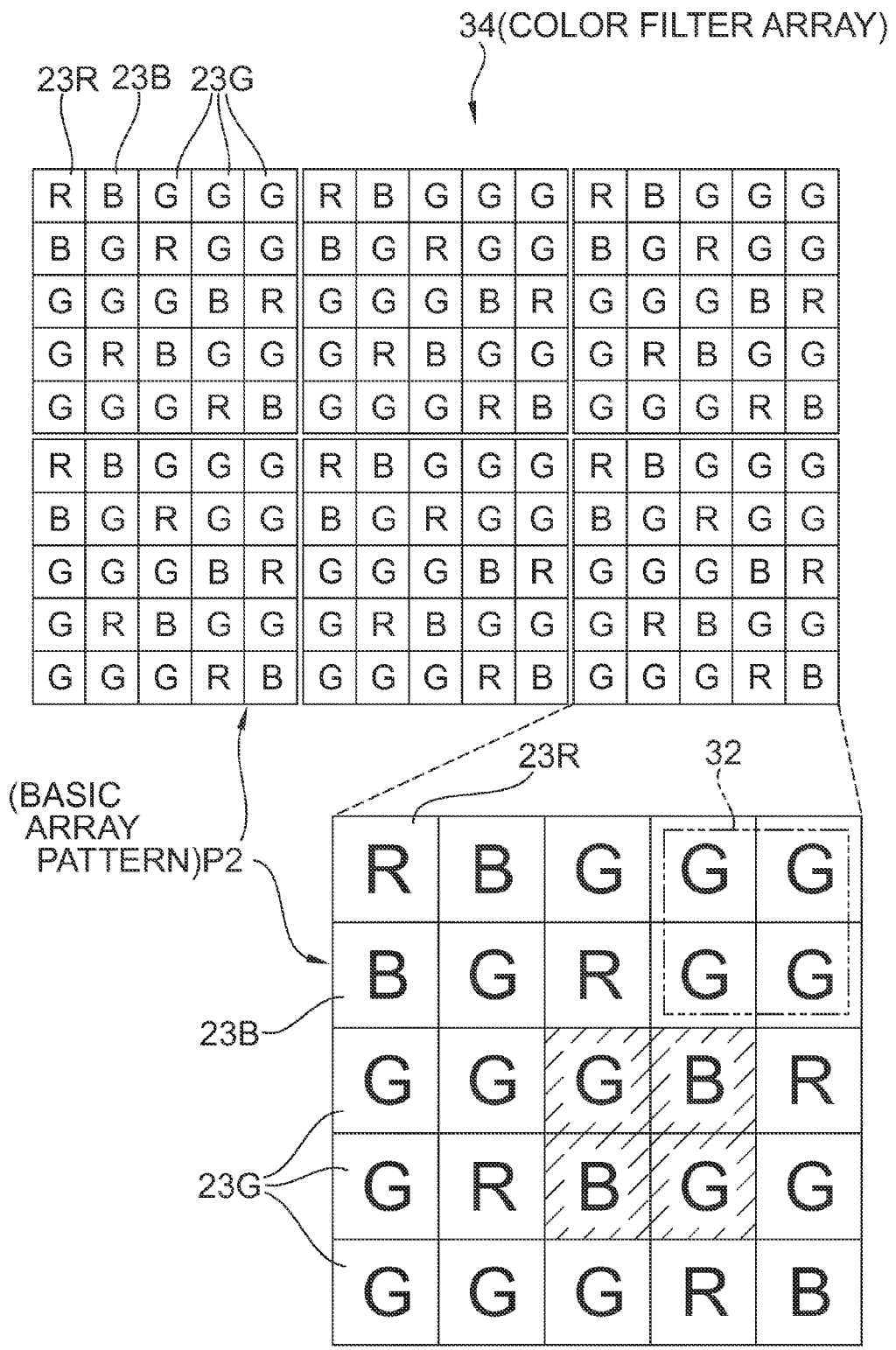
FIG. 10 is a front view of a color filter array of a 2-1st embodiment.

As illustrated in FIG. 10, a color filter array 34 is formed by repeatedly disposing a basic array pattern P3 different from the basic array pattern P2 in the horizontal direction (H) and the vertical direction (V). The basic array pattern P3 is basically the same as the basic array pattern P2 except for that the disposition of the G filter 23G and the B filter 23B is different in the part shown by hatching in the figure. Therefore, the color filter array 34 has features (1) to (4), (5a) and (7) similarly to the above-mentioned color filter array 30, and the effect similar to that of the color filter array 30 can be acquired.

[Color Filter Array of 2-2nd and 2-3rd Embodiments]

In the above-mentioned color filter arrays 30 and 34, filters of different colors are adjacently disposed in each direction (H, V, NE, NW) of the R filter 23R, but filters of different colors may be adjacently disposed in each direction (H, V, NE, NW) of the B filter 23B. In this case, the color filter array is formed with a basic array pattern P2' (see FIG. 11) or a basic array pattern P3' (see FIG. 12).

The basic array pattern P2' illustrated in FIG. 11 is an array pattern that reverses the disposition of the R filter 23R and the B filter 23B in the basic array pattern P2. Moreover, the basic array pattern P3' illustrated in FIG. 12 is an array pattern that reverses the disposition of the R filter 23R and the B filter 23B in the basic array pattern P3. Therefore, in the color filter array formed with the basic array pattern P2' or P3', filters of different colors are adjacently disposed in each direction (H, V, NE, NW) of the B filter 23B, but the R filters 23R of the same color are adjacently disposed in the oblique (NE, NW) directions of the R filter 23R (feature (5b)).

Thus, since the color filter array formed with the basic array pattern P2' or P3' has features (1) to (4), (5b) and (7), it is possible to acquire the effect similar to that of the color filter array of the second embodiment except for that it is possible to improve the accuracy of demosaicing processing of the B pixel instead of the R pixel.

<Condition of First Filter (First Color)>

In each above-mentioned embodiment, an explanation is given using an example of the G filter 23G of the G color as the first filter having the first color of the present invention, but the same effect can be acquired even by using a filter that satisfies any of following conditions (1) to (4) instead of the G filter 23G or instead of part of the G filter 23G.

[Condition (1)]

Condition (1) is that the contribution ratio to acquire a brightness signal is 50% or more. This contribution ratio 50% is a value defined to distinguish the first color (such as the G color) and the second color (such as the R and B colors) of the present invention, which is a value defined such that a color whose contribution ratio to acquire brightness data is relatively higher than the R color and the B color is included in the "first color". Since the contribution ratio of the G color becomes 60% as shown in above-mentioned equation (1), condition (1) is satisfied. Moreover, the contribution ratios of other colors than the G color can also be acquired by experiment or simulation. Therefore, a filter having a color whose contribution ratio is 50% or more excluding the G color can be used as the first filter of the present invention. Here, a color whose contribution ratio is less than 50% becomes the second color (such as the R color and the B color) of the present invention, and a filter having this color becomes the second filter of the present invention.

[Condition (2)]

Condition (2) is that the peak of the transmittance of a filter is within a wavelength range from 480 or more nm to 570 nm or less. As for the transmittance of the filter, for example, a value measured by a spectrophotometer is used. This wavelength range is a range defined to distinguish the first color (such as the G color) and the second color (such as the R and B colors) of the present invention, which is a range defined such that the peak of the R color or B color whose contribution ratio mentioned above is relatively low is not included and the peak of the G color whose contribution ratio is relatively high is included. Therefore, a filter in which the peak of transmittance is within a wavelength range from 480 nm or more to 570 nm or less can be used as the first filter. Here, a filter in which the peak of transmittance is outside the wavelength range from 480 nm or more to 570 nm or less becomes the second filter (R filter 23R and B filter 23B) of the present invention.

[Condition (3)]

Condition (3) is that the transmittance within a wavelength range from equal to or greater than 500 nm to equal to or less than 560 nm (from 500 nm or more to 560 nm or less) is higher than the transmittance of the second filter (R filter 23R and B filter 23B). Even in this condition (3), as for the filter transmittance, for example, a value measured by a spectrophotometer is used. The wavelength range of this condition (3) is a range defined to distinguish the first color (such as the G color) and the second color (such as the R and B colors) of the present invention, and denotes a range in which the transmittance of a filter having a color whose contribution ratio mentioned above is relatively higher than the R color and the B color is higher than the transmittance of the RB filters 23R and 23B. Therefore, a filter in which the transmittance is relatively high within a wavelength range from equal to or greater than 500 nm to equal to or less than 560 nm can be used as the first filter, and a filter in which the transmittance is relatively low can be used as the second filter.

[Condition (4)]

Condition (4) is that filters of two or more colors including a color that most contributes to a brightness signal among three primary colors (for example, the G color of RGB) and a color different from these three primary colors can be used as the first filter. In this case, a filter corresponding to a color different from each color of the first filter becomes the second filter.

[Color Imaging Element of Third Embodiment]

Figure 13:
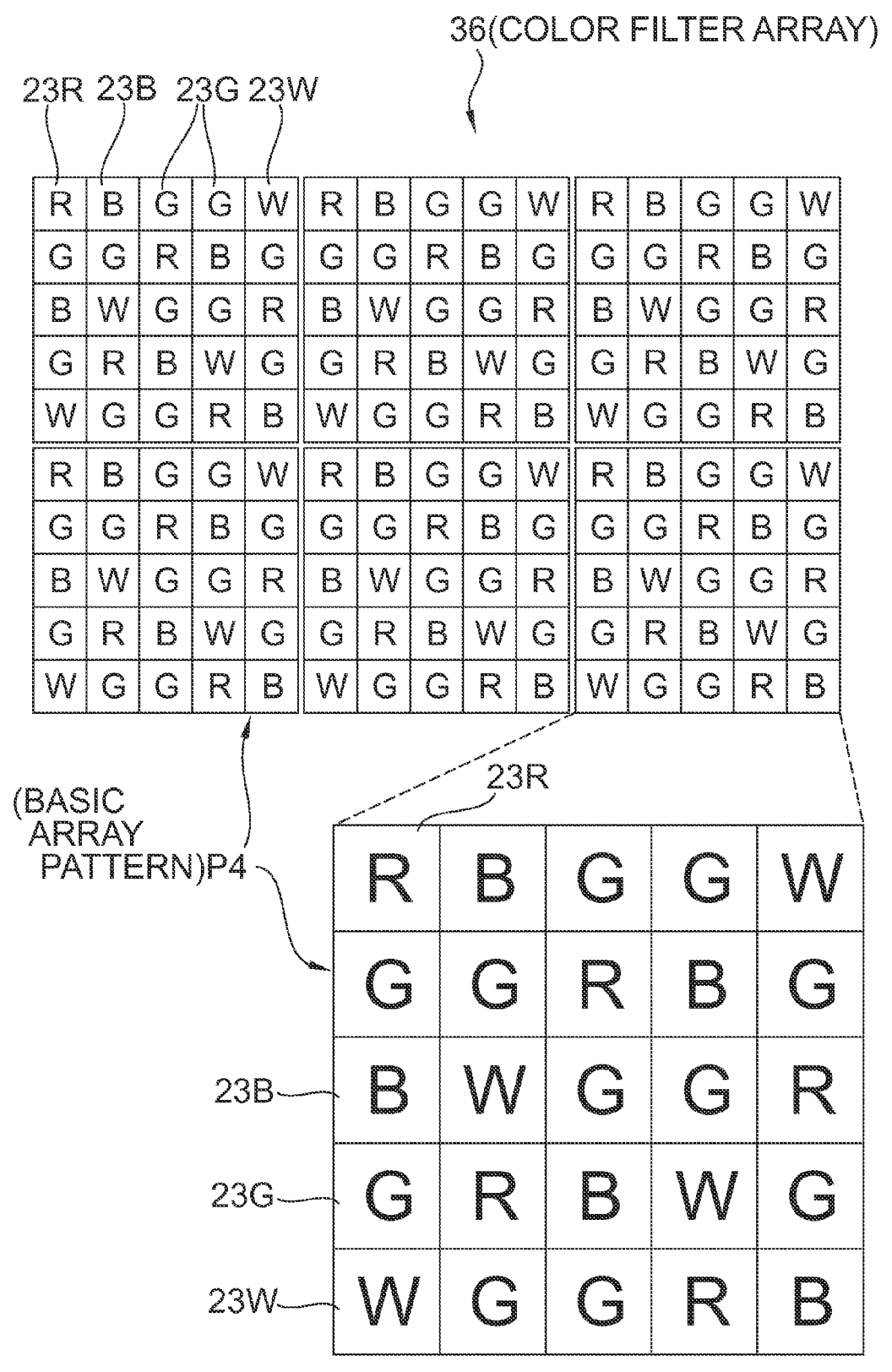

Next, the color imaging element of the third embodiment of the present invention is described using FIG. 13. Here, the color imaging element of the third embodiment has basically the same configuration as the above-mentioned first embodiment except for that it includes a white pixel (which may be called a clear pixel) that receives white light (light of a wavelength region of visible light) besides RGB pixels. Therefore, regarding what has the same function or configuration as that of the above-mentioned first embodiment, the same reference numeral is assigned and explanation thereof is omitted.

[Color Filter Array of Third Embodiment]

The color imaging element of the third embodiment includes a color filter array 36 different from that of the first embodiment. The color filter array 36 includes a basic array pattern P4 in which the above-mentioned RGB filters 23R, 23G and 23B, and a transparent filter 23W (first filter) are arrayed in an array pattern corresponding to 5×5 pixels, and this basic array pattern P4 is repeatedly disposed in the horizontal and vertical directions (H, V). Therefore, the color filter array 36 has above-mentioned feature (1).

The basic array pattern P4 has an array pattern in which part of the G filters 23G of the basic array pattern P1 is replaced with the transparent filter 23W. For example, the G filter 23G adjacent to other G filters 23G in the horizontal and vertical directions (H, V) is replaced with the transparent filter 23W. By this means, it is possible to realize high sensitivity, and, even if the pixel size is miniaturized by leaving the G pixel, it is possible to suppress the degradation of color reproducibility.

The transparent filter 23W is a filter of a transparent color (first color). The transparent filter 23W can transmit light corresponding to the wavelength region of visible light, and, for example, denotes a filter in which the light transmittance of each color of RGB is 50% or more. Since the transmittance of the transparent filter 23W is higher than that of the G filter 23G, the contribution ratio to acquire a brightness signal is also higher than the G color (60%), and above-mentioned condition (1) is satisfied.

Figure 14:
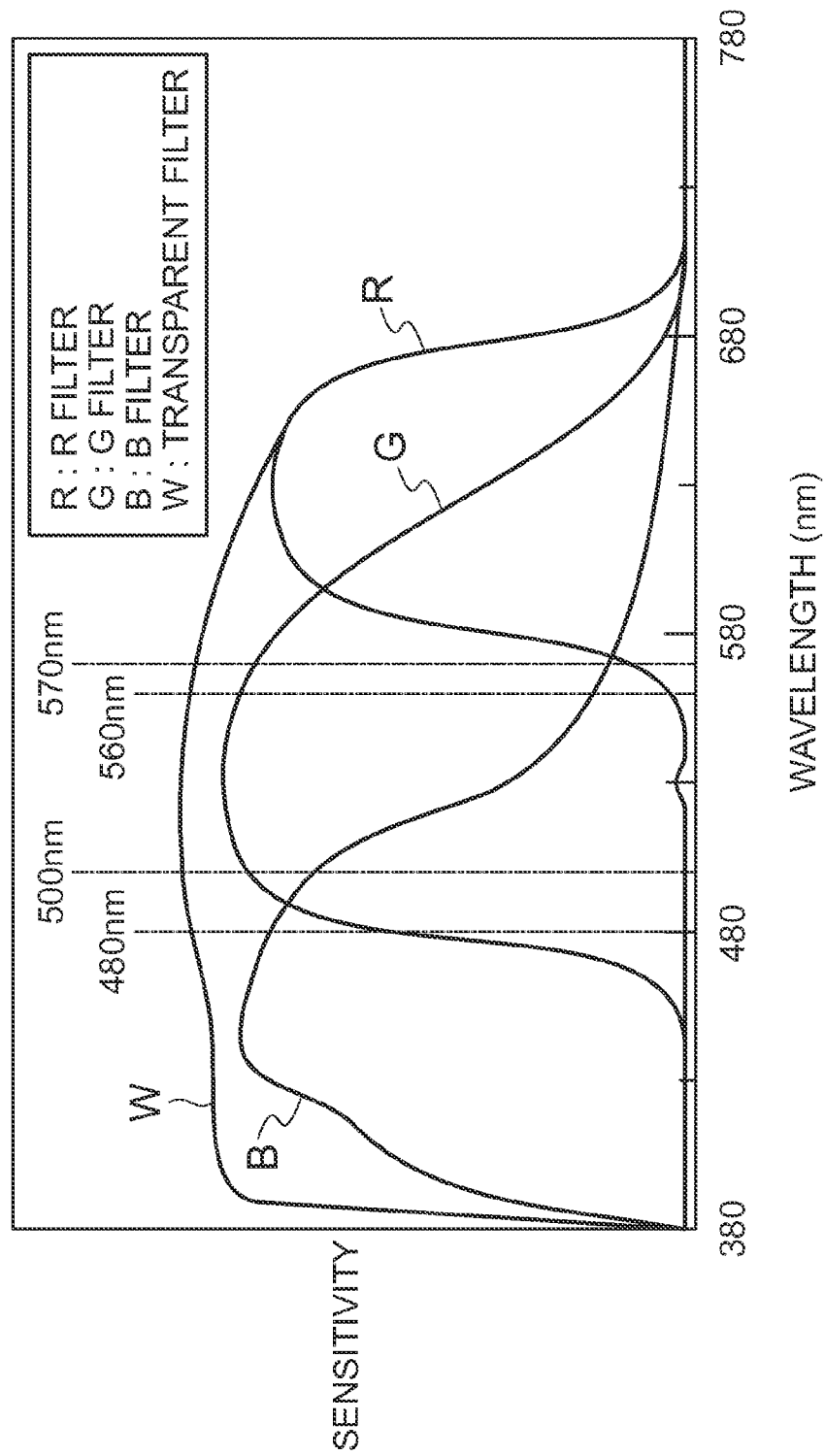
FIG. 14 is a graph illustrating spectral sensitivity characteristic of the color filter array of the third embodiment.

In FIG. 14 that illustrates the spectral sensitivity characteristic of the color filter array 36, the transmittance peak of the transparent filter 23W (sensibility peak of the white pixel) is within a wavelength range from equal to or greater than 480 nm to equal to or less than 570 nm (from 480 nm or more to 570 nm or less). Moreover, the transmittance of the transparent filter 23W is higher than the transmittances of the RB filters 23R and 23B within a wavelength range from equal to or greater than 500 nm to equal to or less than 560 nm (from 500 nm or more to 560 nm or less). Therefore, the transparent filter 23W satisfies above-mentioned conditions (2) and (3). Here, similarly to the transparent filter 23W, even the G filter 23G satisfies above-mentioned conditions (1) to (3).

Thus, since the transparent filter 23W satisfies above-mentioned conditions (1) to (3), it is possible to use it as the first filter of the present invention. Here, in the color filter array 36, since part of the G filter 23G corresponding to the G color that most contributes to a brightness signal among three primary colors of RGB is replaced with the transparent filter 23W, above-mentioned condition (4) is satisfied.

Returning to FIG. 13, as described above, since the color filter array 36 is basically the same as the color filter array 22 of the first embodiment except for that part of the G filter 23G is replaced with the transparent filter 23W, it has features (2) to (6) similarly to the first embodiment. Therefore, it is possible to acquire the effect similar to the effect described in the first embodiment.

Here, the disposition and number of the transparent filters 23W are not limited to the embodiment illustrated in FIG. 13 and may be arbitrarily changed. In this case, if one or more first filters including the G filter 23G and the transparent filter 23W are included in the filter line of each direction of the horizontal direction (H), vertical direction (V) and oblique directions (NE, NW) of the color filter array 36, above-mentioned feature (2) is satisfied.

[Color Imaging Element of Fourth Embodiment]

Figure 15:
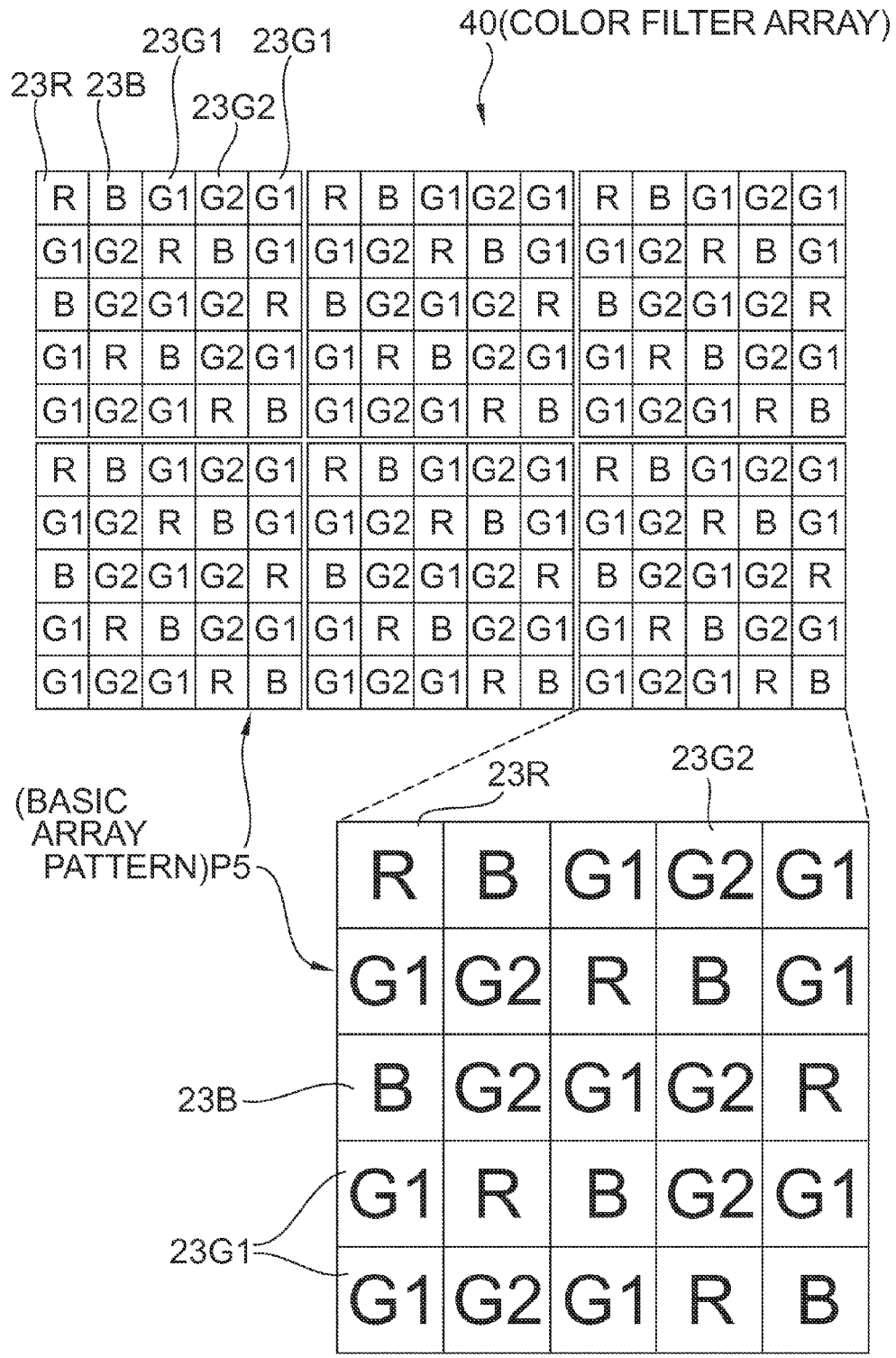
FIG. 15 is a front view of a color filter array of a fourth embodiment having two kinds of G filters.

Next, the color imaging element of the fourth embodiment of the present invention is described using FIG. 15. Here, the color imaging element of the fourth embodiment has basically the same configuration as that of above-mentioned first embodiment except for that it includes two kinds of G pixels. Therefore, regarding what has the same function or configuration as that of the above-mentioned first embodiment, the same reference numeral is assigned and explanation thereof is omitted.

[Color Filter Array of Fourth Embodiment]

The color imaging element of the fourth embodiment includes a color filter array 40 different from that of the first embodiment. The color filter array 40 includes a basic array pattern P5 in which the R filter 23R, a first G filter 23G1 and a second G filter 23G2 (first filter) and the B filter 23B are arrayed in an array pattern corresponding to 5×5 pixels, and this basic array pattern P5 is repeatedly disposed in the horizontal and vertical directions (H, V). Therefore, the color filter array 40 has above-mentioned feature (1).

The basic array pattern P5 has an array pattern in which each G filter 23G of the basic array pattern P1 of the first embodiment is replaced with the first G filter 23G1 or the second G filter 23G2. For example, in the present embodiment, a first G filter 23G1 is disposed in filter lines of the odd numbers in the horizontal direction, and a second G filter 23G2 is disposed in filter lines of the even numbers in the horizontal direction.

Figure 16:
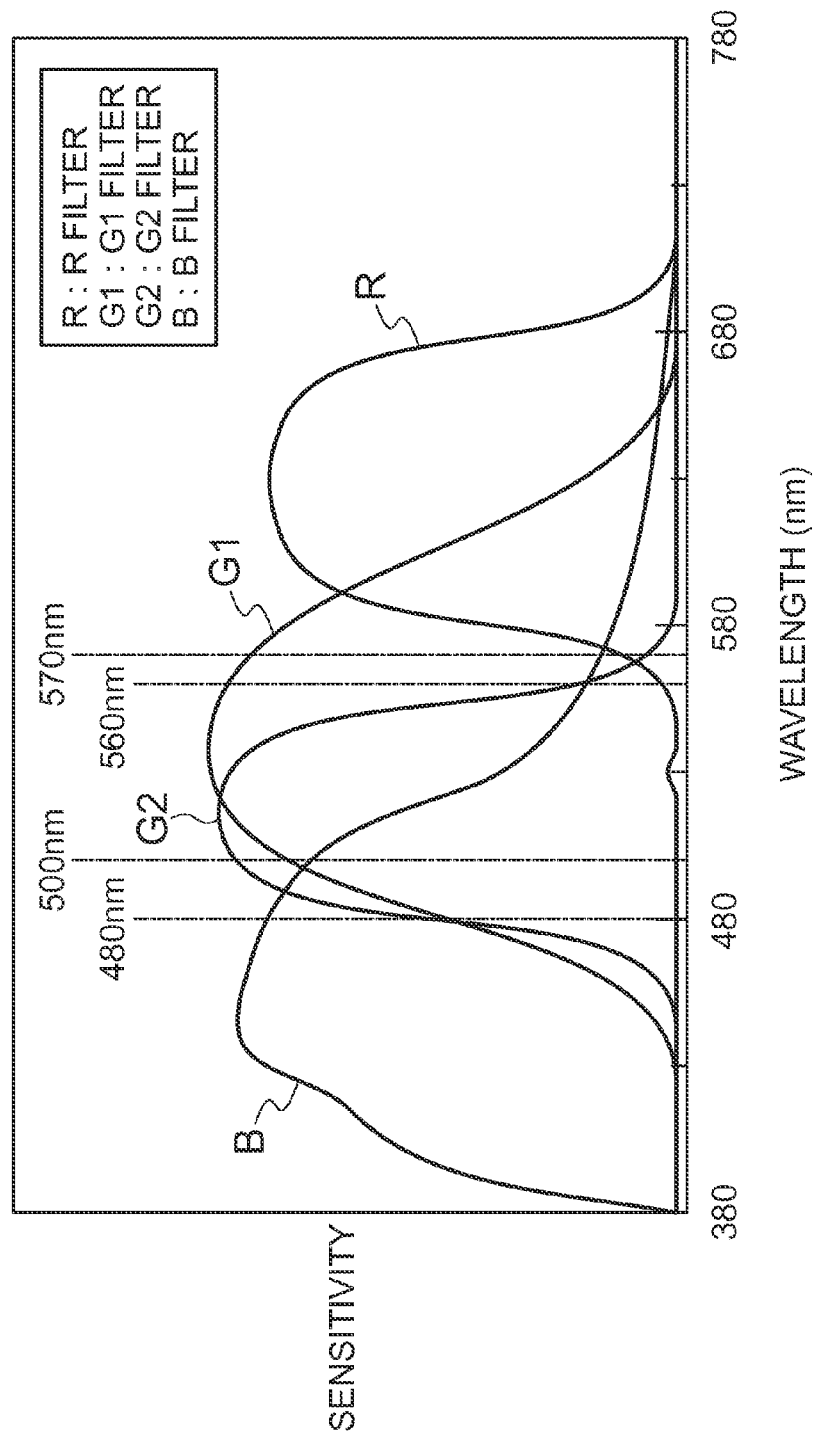
FIG. 16 is a graph illustrating spectral sensitivity characteristic of the color filter array of the fourth embodiment.

The first G filter 23G1 transmits the G light of the first wavelength band, and the second G filter 23G2 transmits the G light of the second wavelength band having high correlation with the first G filter 23G1 (see FIG. 16). As the first G filter 23G1, it is possible to use an existing G filter (for example, G filter 23G of the first embodiment). Moreover, as the second G filter 23G2, it is possible to use a filter having high correlation with the first G filter 23G1. In this case, it is desirable that, for example, the peak value of the spectral sensitivity curve of the second G filter 23G2 is in a wavelength range from 500 nm to 535 nm (near the peak value of the spectral sensitivity curve of the existing G filter). Here, as a method of deciding color filters of four colors (R, G1, G2, B), for example, the method described in Japanese Patent Application Laid-Open No. 2003-284084 is used.

Thus, by assuming image colors acquired by the color imaging element of the fourth embodiment to be four kinds and adding acquired color information, it is possible to express colors more accurately as compared with a case where only three kinds of colors (RGB) are acquired. That is, a color seen as the different one by the eyes can be reproduced as the different color, and a color seen as the same one by the eyes can be reproduced as the same color (improve "discrimination of colors").

Since the transmittances of the first and second G filters 23G1 and 23G2 are basically the same as the transmittance of the G filter 23G of the first embodiment, the contribution ratio to acquire a brightness signal becomes higher than 50%. Therefore, the first and second G filters 23G1 and 23G2 satisfy above-mentioned condition (1).

Moreover, in FIG. 16 that illustrates the spectral sensitivity characteristic of the color filter array 40, the transmittance peak of each of the G filters 23G1 and 23G2 (sensibility peak of each G pixel) is within a wavelength range from equal to or greater than 480 nm to equal to or less than 570 nm (from 480 nm or more to 570 nm or less). Furthermore, the transmittance of each of the G filters 23G1 and 23G2 becomes higher than the transmittances of the RB filters 23R and 23B within a wavelength range from equal to or greater than 500 nm to equal to or less than 560 nm (from 500 nm or more to 560 nm or less). Therefore, each of the G filters 23G1 and 23G2 satisfies above-mentioned conditions (2) and (3) too.

Returning back to FIG. 15, since the color filter array 40 is basically the same as the color filter array 22 of the first embodiment except for that it includes each of the G filters 23G1 and 23G2, it has above-mentioned features (2) to (6) similarly to the first embodiment. Therefore, it is possible to acquire the effect similar to the effect described in the first embodiment.

Here, the disposition and number of G filters 23G1 and 23G2 are not limited to the embodiment illustrated in FIG. 15 and may be arbitrarily changed. Moreover, the G filter kind may be increased to three kinds or more.

[Color Imaging Element of Fifth Embodiment]

Figure 17:
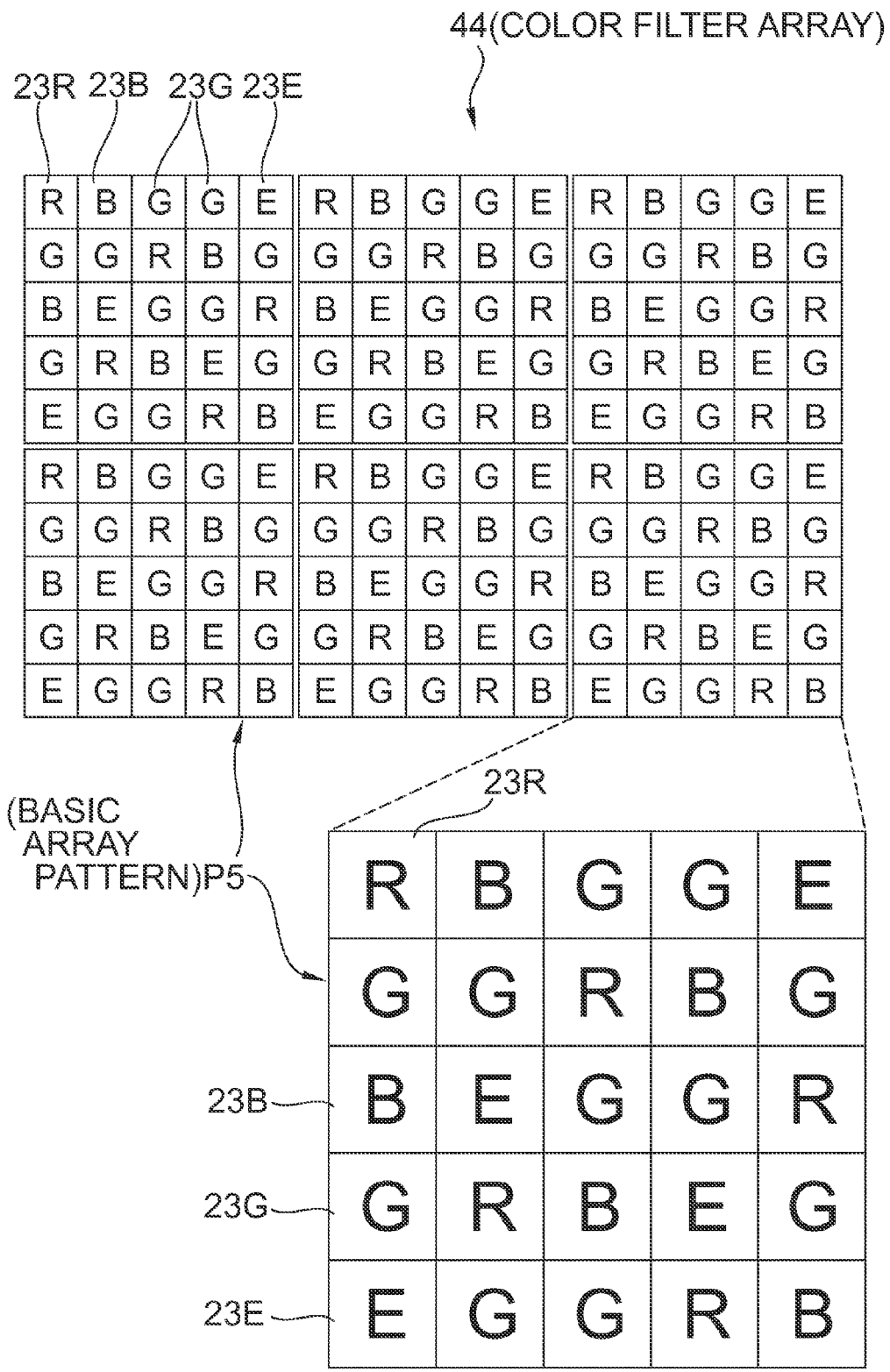
FIG. 17 is a front view of a color filter array of a fifth embodiment having an emerald filter.

Next, the color imaging element of the fifth embodiment of the present invention is described using FIG. 17. Here, the color imaging element of the fifth embodiment has basically the same configuration as that of the above-mentioned first embodiment except for that it includes the E pixel that receives light of the emerald (E) color corresponding to the fourth color of the present invention besides RGB pixels. Therefore, regarding what has the same function or configuration as that of the above-mentioned first embodiment, the same reference numeral is assigned and explanation thereof is omitted.

[Color Filter Array of Fifth Embodiment]

The color imaging element of the fifth embodiment includes a color filter array 44 different from that of the first embodiment. The color filter array 44 includes a basic array pattern P6 in which the above-mentioned RGB filters 23R, 23G and 23B and an E filter 23E (first filter) are arrayed in an array pattern corresponding to 5×5 pixels, and this basic array pattern P6 is repeatedly disposed in the horizontal and vertical directions (H, V). Therefore, the color filter array 44 has above-mentioned feature (1).

The basic array pattern P6 has an array pattern in which the transparent filter 23W of the basic array pattern P4 of the third embodiment illustrated in FIG. 13 is replaced with the E filter 23E. Thus, by using the color filter array 44 of four colors in which part of the G filter 23G is replaced with the E filter 23E, it is possible to improve the reproduction of the high-frequency component of brightness, reduce the jagginess and improve the resolution feeling.

Figure 18:
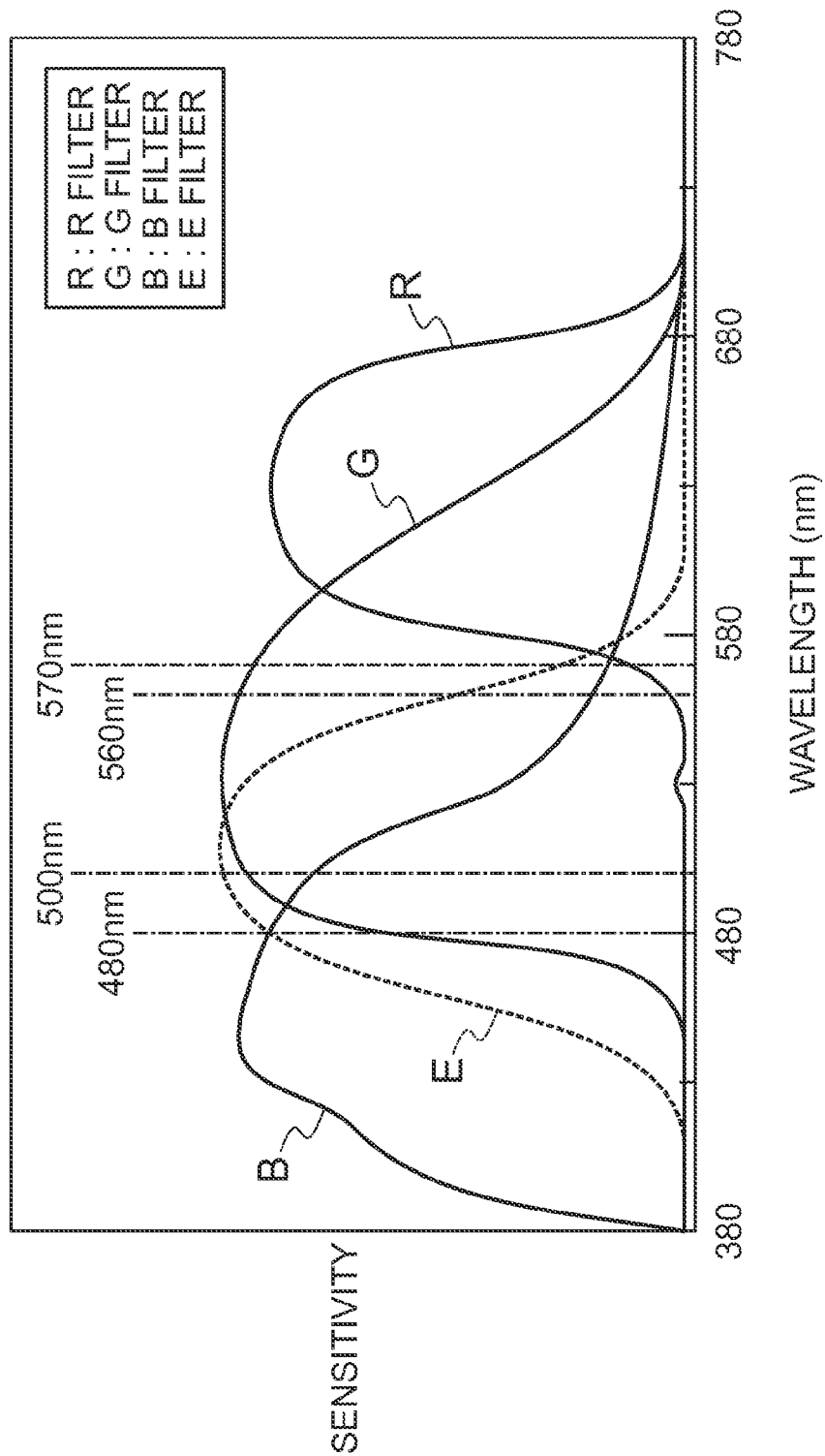
FIG. 18 is a graph illustrating spectral sensitivity characteristic of the color filter array of the fifth embodiment.

In FIG. 18 that illustrates the spectral sensitivity characteristic of the color filter array 44, the transmittance peak of the E filter 23E (sensibility peak of the E pixel) is within a wavelength range from equal to or greater than 480 nm to equal to or less than 570 nm. Moreover, the transmittance of the E filter 23E becomes higher than the transmittances of the RB filters 23R and 23B within a wavelength range from equal to or greater than 500 nm to equal to or less than 560 nm. Therefore, the E filter 23E satisfies above-mentioned conditions (2) and (3). Moreover, in the color filter array 44, since part of the G filter 23G corresponding to the G color that most contributes to a brightness signal among three primary colors of RGB is replaced with the E filter 23E, it satisfies above-mentioned condition (4).

Here, the spectral characteristic illustrated in FIG. 18 has a peak on the shorter wavelength side than the G filter 23G, but there may be a case where it has the peak on the longer wavelength side than the G filter 23G (it is seen as a color slightly close to yellow). Thus, as the E filter 23E, it is possible to arbitrarily select the one that satisfies each condition of the present invention, and, for example, it is also possible to select the E filter 23E that satisfies condition (1).

Returning to FIG. 17, as described above, since the color filter array 44 is basically the same as the color filter array 22 of the first embodiment except for that part of the G filter 23G is replaced with the E filter 23E, it has features (2) to (6) similarly to the first embodiment. Therefore, it is possible to acquire the effect similar to the effect described in the first embodiment.

Here, the disposition and number of E filters 23E may be changed to the disposition and number different from those of the embodiment illustrated in FIG. 17. In this case, if one or more first filters including the G filter 23G and the E filter 23E are included in the filter line of each direction of the horizontal direction (H), vertical direction (V) and oblique directions (NE, NW) of the color filter array 44, above-mentioned feature (2) is satisfied.

Moreover, the E filter 23E is used as the first filter of the present invention in the above-mentioned fifth embodiment, but, for example, there is the one that does not satisfy above-mentioned conditions (1) to (4) among E filters 23E. Therefore, such an E filter 23E may be used as the second filter of the present invention.

[Others]

The basic array pattern of each color filter array of each embodiment described above is arrayed in an array pattern corresponding to 5×5 pixels, for example, it may be arrayed in an array pattern corresponding to 7×7 pixels like a basic array pattern P7 of a color filter array 48 illustrated in FIG. 19 and a basic array pattern P8 of a color filter array 50 illustrated in FIG. 20.

The basic array pattern P7 is basically the same as the basic array pattern P1 except for that the basic array pattern P1 of the first embodiment is expanded to 7×7 pixels, and it further includes the above-mentioned square array 32. Therefore, the color filter array 48 has above-mentioned features (1) to (7).

The basic array pattern P8 is basically the same as the basic array pattern P2 except for that the basic array pattern P2 of the second embodiment is expanded to 7×7 pixels. Therefore, the color filter array 50 has features (1) to (4), (5a) and (7) similarly to the color filter array 30 of the second embodiment.

Here, even the basic array patterns P3 to P6 of the above-mentioned 2-1st to fifth embodiments may be arrayed in an array pattern corresponding to 7×7 pixels though the illustration is omitted. In addition, the basic array pattern of each embodiment may be arrayed in an array pattern corresponding to 9×9 pixels, that is, the basic array pattern may be arrayed in an array pattern corresponding to N×N (N is an odd number equal to or greater than 5) pixels. However, while signal processing such as demosaicing becomes complicated if N is increased, a special effect by enlarging the size of the basic array pattern cannot be acquired. Therefore, from the viewpoint to prevent the signal processing from becoming complicated, it is preferable that the size of the basic array pattern is equal to or less than 7×7 pixels, and, from the viewpoint to simplify the signal processing, it is more preferable that the basic array pattern corresponds to 5×5 pixels.

Each color filter array of each embodiment described above includes a basic array pattern in which the color filter of each color is two-dimensionally arrayed in the horizontal direction (H) and the vertical direction (V) and which is formed by repeatedly disposing this basic array pattern in the horizontal direction (H) and the vertical direction (V), but the present invention is not limited to this.

Figure 21:
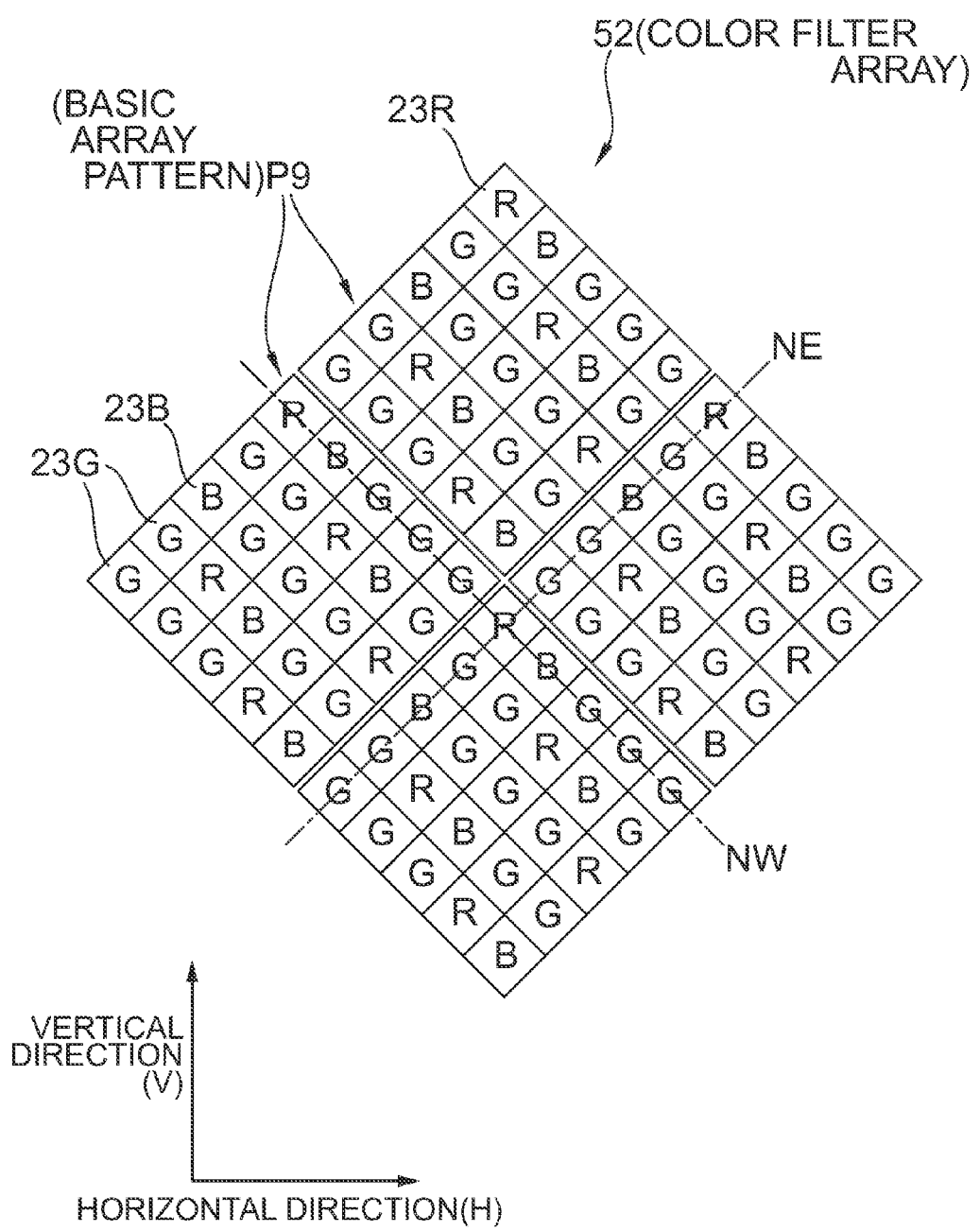
FIG. 21 is a front view of a color filter array of another embodiment with a color filter array as a honeycomb array.
Figure 22:
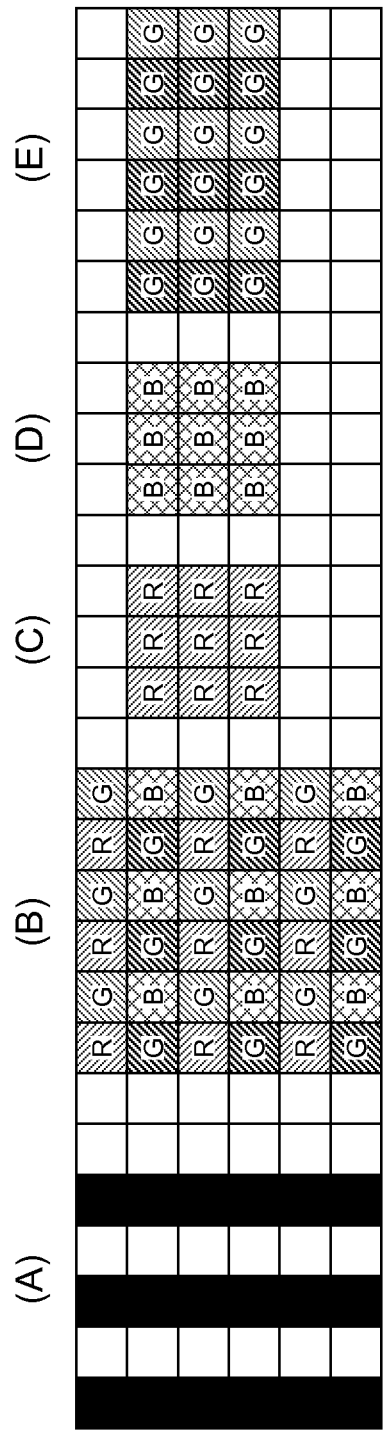
FIG. 22 is a diagram used to describe a problem of a color imaging element having a color filter of a Bayer array in the related art.

For example, like a color filter array 52 illustrated in FIG. 21, it may be an array pattern which includes a basic array pattern P9 of a so-called honeycomb array shape formed by two-dimensionally arraying the RGB filters 23R, 23G and 23B in the oblique directions (NE, NW) and which is formed by repeatedly disposing the basic array pattern P9 in the oblique directions (NE, NW). In this case, the oblique directions (NE, NW) become the first and second directions of the present invention, and the horizontal and vertical directions (H, V) become the third and fourth directions of the present invention.

Since such the color filter array 52 is an array pattern in which the color filter array 22 of the first embodiment is rotated by 45° around the optical axis of the imaging optical system 10, it has features (1) to (6) similarly to the above-mentioned first embodiment. Here, even regarding the above-mentioned basic array patterns P2 to P8, the honeycomb array may be similarly applied though the illustration is omitted.

A color filter array formed with color filters of primary colors RGB has been described in the above-mentioned first embodiment and so on, but, for example, the present invention is applicable even to a color filter array of complementary color filters of four colors adding G to C (cyan), M (magenta), and Y (yellow) which are complementary colors of primary colors RGB. Even in this case, a color filter that satisfies any of above-mentioned conditions (1) to (4) is assumed to be the first filter of the present invention and the other color filters are assumed to be the second filter.

Here, it is needless to say that the color filter array of the color imaging element of the present invention is not limited to the abovementioned embodiments and various changes are possible without departing from the spirit of the present invention. For example, the color filter arrays of the above-mentioned respective embodiments may be arbitrarily combined. Moreover, a combination of at least two kinds among the G filter 23G, the transparent filter 23W, the first and second G filters 23G1 and 23G2, the E filter 23E and so on may be used as the first filter of the present invention, or other color filters that satisfy any of above-mentioned conditions (1) to (4) may be used. In addition, other color filters than the RB filters 23R and 23B may be used as the second filter of the present invention.

A color imaging element mounted to a digital camera has been described in the above-mentioned respective embodiments, but the present invention is applicable to a color imaging element mounted to various kinds of electronic equipment (imaging devices) having a photograph function such as a smart phone, a mobile telephone and a PDA.

What is claimed is:

1. A single-plate color imaging element including:
multiple pixels including photoelectric conversion elements arrayed in a first direction and a second direction which is perpendicular to the first direction; and
color filters which are respectively arrayed on the multiple pixels,
wherein: an array of the color filters includes a basic array pattern in which the color filters are arrayed in an array pattern corresponding to N×N (N is an odd number equal to or greater than 5) pixels in the first direction and the second direction, and the array is formed by repeatedly disposing the basic array pattern in the first direction and the second direction;
the color filters include first filters which are green filters and second filters which are red and blue filters, a ratio of the first filters to the total number of filters is larger than a ratio of the second filters to the total number of filters, and the array of the color filters comprises only red, green, and blue filters;

one or more first filters are disposed in each filter line in each direction including the first direction, the second direction, and a third direction and a fourth direction that incline to the first direction and the second direction, in the array of the color filters;

second filters of each color of the second colors are disposed in each filter line in the first direction and the second direction in the basic array pattern one by one; and each color filter adjacently disposed in the first through fourth directions to each second filter of a particular second color in the basic array pattern is either a first filter or a second filter of a second color different from the particular second color.

2. The color imaging element according to claim 1, wherein, in each direction of the second filter of one color among each color of the second colors in the basic array pattern, the second filter of a different color from that second filter or the first filter is adjacently disposed.

3. The color imaging element according to claim 2, wherein the basic array pattern includes a 2×2 array of green filters.

4. The color imaging element according to claim 2, wherein, when a direction different from the first direction by θ° shown by an equation (1) is assumed to be a fifth direction, oblique filter arrays formed by disposing the second filters of one color among each color of the second colors at regular intervals along the fifth direction, are disposed at regular intervals along the second direction $$\theta = \tan^{-1}(1/2).$$ Equation (1)

5. The color imaging element according to claim 1, wherein, when the color filter is a square shape, the third direction and the fourth direction are different by 45° with respect to the first direction and the second direction respectively.

6. A single-plate color imaging element including:

multiple pixels including photoelectric conversion elements arrayed in a first direction and a second direction which is perpendicular to the first direction; and color filters which are respectively arrayed on the multiple pixels, wherein: an array of the color filters includes a basic array pattern in which the color filters are arrayed in an array pattern corresponding to N×N (N is an odd number equal to or greater than 5) pixels in the first direction and the second direction, and the array is formed by repeatedly disposing the basic array pattern in the first direction and the second direction;

the color filters include first filters corresponding to a first color whose transmittance peak is within a wavelength range from 480 nm to 570 nm, and second filters corresponding to second colors of two or more colors whose transmittance peak is outside the range, and a ratio of the first filters to a total number of filters is larger than a ratio of the second filters to the total number of filters;

one or more first filters are disposed in each filter line in each direction including the first direction, the second direction, and a third direction and a fourth direction that incline to the first direction and the second direction, in the array of the color filters;

second filters of each color of the second colors are disposed in each filter line in the first direction and the second direction in the basic array pattern one by one; and each color filter adjacently disposed in the first through fourth directions to each second filter of a particular second color in the basic array pattern is either a first filter or a second filter of a second color different from the particular second color.

7. A single-plate color imaging element including:

multiple pixels including photoelectric conversion elements arrayed in a first direction and a second direction which is perpendicular to the first direction; and color filters which are respectively arrayed on the multiple pixels, wherein: an array of the color filters includes a basic array pattern in which the color filters are arrayed in an array pattern corresponding to N×N (N is an odd number equal to or greater than 5) pixels in the first direction and the second direction, and the array is formed by repeatedly disposing the basic array pattern in the first direction and the second direction;

the color filters include first filters corresponding to a first color and second filters corresponding to second colors of two or more colors whose transmittance is lower than that of the first filters within a wavelength range from 500 nm to 560 nm, and a ratio of the first filters to a total number of filters is larger than a ratio of the second filters to the total number of filters;

one or more first filters are disposed in each filter line in each direction including the first direction, the second direction, and a third direction and a fourth direction that incline to the first direction and the second direction, in the array of the color filters;

second filters of each color of the second colors are disposed in each filter line in the first direction and the second direction in the basic array pattern one by one; and each color filter adjacently disposed in the first through fourth directions to each second filter of a particular second color in the basic array pattern is either a first filter or a second filter of a second color different from the particular second color.

8. An imaging device comprising:

an imaging optical system;

a color imaging element in which an object image is formed through the imaging optical system; and an image data generation unit configured to generate image data of the formed object image, wherein the color imaging element is the color imaging element according to claim 1.

* * * * *